(12) United States Patent
Chippendale et al.

(10) Patent No.: US 6,477,277 B1
(45) Date of Patent: Nov. 5, 2002

(54) DATA ENCODING SYSTEM

(75) Inventors: Paul Chippendale; Bahram Honary, both of Lancaster; Paul C. Arthur, Malvern; Melville J. Maundrell, Malvern; Ian Sargeant, Malvern, all of (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/254,146

(22) PCT Filed: Jun. 26, 1998

(86) PCT No.: PCT/GB98/01877

§ 371 (c)(1),
(2), (4) Date: Mar. 25, 1999

(87) PCT Pub. No.: WO99/01981

PCT Pub. Date: Jan. 14, 1999

(30) Foreign Application Priority Data

Jul. 4, 1997 (GB) .............................................. 9714124

(51) Int. Cl.[7] .................................................. G06K 9/36
(52) U.S. Cl. ..................................... 382/232; 358/261.1
(58) Field of Search ................................. 382/232, 244, 382/245, 246, 247; 358/261.1, 427

(56) References Cited

U.S. PATENT DOCUMENTS

| 4,682,215 A | 7/1987 | Adachi ......................... 358/75 |
| 5,341,440 A | 8/1994 | Earl et al. ...................... 382/56 |

FOREIGN PATENT DOCUMENTS

| DE | 196 06 178 A | 9/1996 | ............ H04N/1/64 |
| GB | 2 286 942 A | 8/1995 | ............ H04N/7/26 |
| WO | WO 97 03516 A | 1/1997 | ............ H04N/7/26 |

*Primary Examiner*—Jerome Grant, II
(74) *Attorney, Agent, or Firm*—Nixon & Vanderhye P.C.

(57) ABSTRACT

Pixel data are encoded as grouping element data devoid of end of line indications. Input data analyzing means is arranged to generate digits which are representative both of data distributions and data occurrences and processing means identify groupings of digits of mutually similar value. In one embodiment the image is analyzed for determining the occurrences of value 0, value 1, . . . , value 15 of the pixels and theses values are ranked according to their occurrence figures. Values which occur most frequently are coded with relatively many "0" bits and values which occur less frequently are coded with relatively many "1" bits. The bit planes are then entropy encoded. Also each bit lane can be encoded by encoding the positions and sizes of squares of elements of bit value "1".

34 Claims, 3 Drawing Sheets

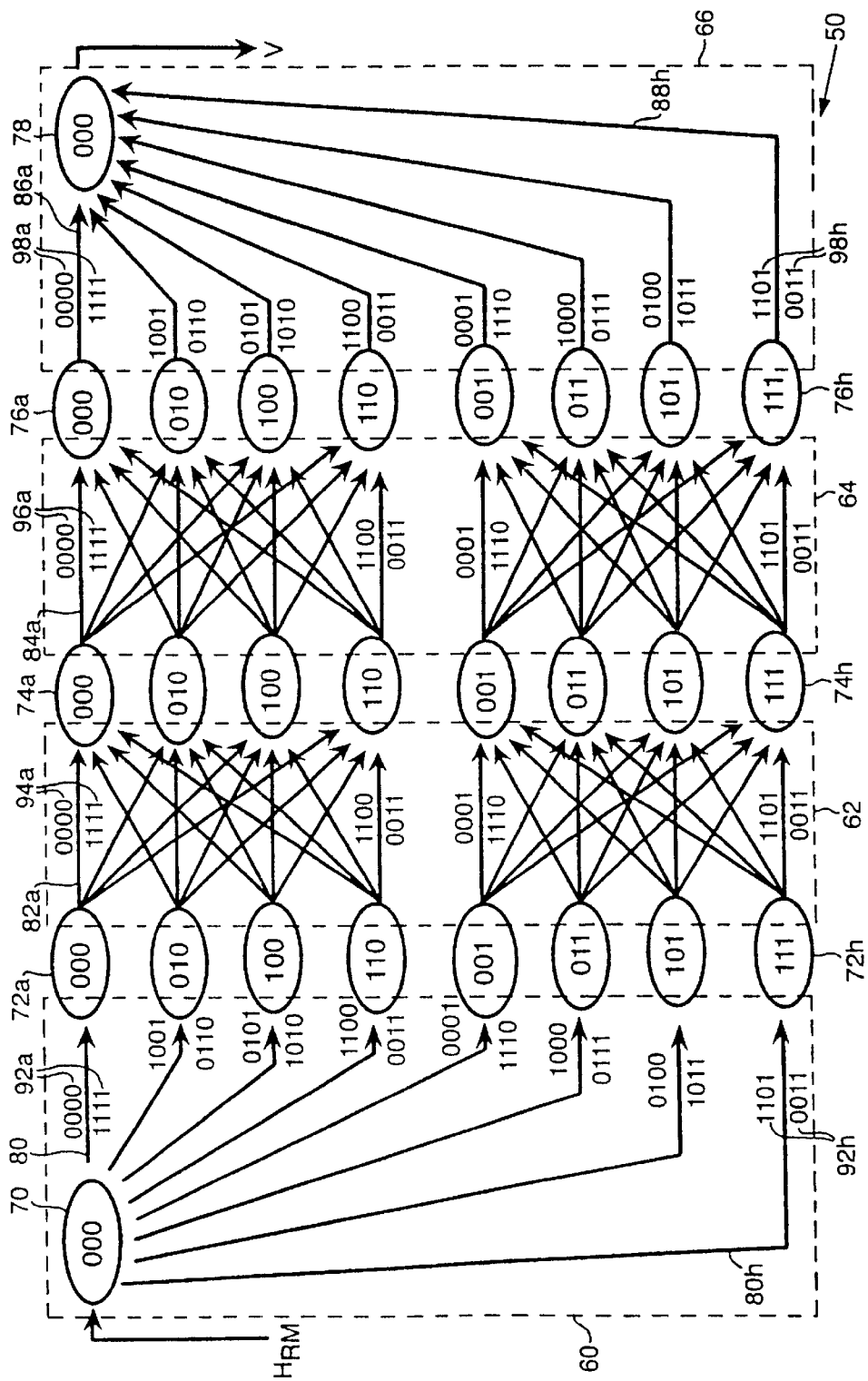

DATA ENCODING SYSTEM

This invention relates to a data encoding system, and more particularly but not exclusively to an encoding system for encoding, transmitting and decoding image data.

Encoding systems for encoding, transmitting and decoding image data, for example facsimile systems, are well known in the prior art. These systems comprise transceivers which are linkable to one another through one or more serial communication channels, for example a telephone link. In one of these systems, an image to be communicated from a first transceiver is conveyed therefrom as a stream of information through one or more channels to a second transceiver whereat the image is received and then reproduced. The image is partitioned at the first transceiver into a series of parallel image bands which are scanned to provide a sequence of data packets in which each band is represented by a corresponding data packet. End of line (EOL) data are inserted between each of these packets to punctuate them and thereby provide composite encoded data suitable for transmission. The packets are not each individually identifiable by an address reference defining their corresponding band position within the image but are arranged relative to one another in a sequence in which the bands are abuttable to form the image. In the sequence, the packets are said to be relatively addressed by their position therein.

These systems suffer from a problem that relatively addressed data loses spatial accuracy if EOL data has been lost as a result of data corruption. Moreover, synchronisation problems may also result when EOL data following corrupted data are not reliably recognised. Data corruption may render a received image unintelligible.

The probability of a data corruption occurring in the systems described above increases as transmission duration increases. For example, an image communicated by facsimile at standard CCITT (Consultative Committee on International Telegraph and Telephone) resolution may involve transfer of data representing approximately two million bits of information. This is described in a book "FAX: Facsimile Technology and Applications Handbook" ISBN 0 89006 495 4 McConnell, Bodson and Schaphorst 1992. If these data are communicated in uncompressed form through a communication channel at a rate of 2400 bits per second (bps), data transmission duration will be approximately fourteen minutes. Data corruption during such an interval is likely to occur in systems in which fading and interference phenomena are experienced over shorter timescales than this.

Restricted communication bandwidth limiting information communication rates to approximately 2400 bps is particularly characteristic of high frequency (HF) radio systems which operate by emitting and receiving electromagnetic radiation in a frequency range of 3 to 30 MHz. Such radio systems are prone to transmission problems such as interference, signal fading and multipath effects which may result in errors being introduced into information conveyed through them; this is particularly pertinent when transmission durations are long. Despite the problems, HF radio systems provide an important advantage of beyond line of sight communication and are presently employed, for example, in maritime applications. Techniques for coping with the transmission problems are clearly important for such systems.

Current compression techniques for reducing problems of data corruption when transmitting packets of data through error prone channels rely on using compression algorithms for decreasing redundancy in the data, thereby reducing data transmission duration. Robustness of compressed data thereby generated to transmission errors is further increased by adding error control code data to it. Such techniques decrease image transmission time although inclusion of the control code data tends to offset data size reduction benefits arising from data compression. Although such techniques are effective for removing occasional errors occurring during data transmission, a problem arises when errors occur more frequently than the control codes are able to compensate. This results in extensive damage to the compressed data on account of its reduced redundancy. These excess errors render an image conveyed to the receiving transceiver possibly unintelligible and, at best, flawed.

The error control codes described above include forward error correction (FEC) codes incorporating parity bits. Automatic repeat request (ARQ) codes are sent in reply from a second transceiver receiving data to a first transceiver transmitting the data when the data are corrupted during transmission to instruct the first transceiver to retransmit the data. In the case of prior art facsimile systems, ARQ codes returned when transmission errors have occurred invoke retransmission of an entire image to which the ARQ codes relate. Retransmission of parts of the image is not possible in these prior art systems because they are devoid of facilities for relating isolated retransmitted parts of the image together.

In a modified Huffman encoding technique, for example as used for CCITT group 3 standard facsimile, each data packet is encoded into a series of variable length codewords separated by a robust EOL code. This is described in a publication "International digital facsimile coding standards" Hunter and Robinson, Proc. IEEE-68, pp. 854–867. Although this Huffman technique which employs relative addressing is effective at limiting error propagation from one packet to another and providing data compression, it is frequently unable to provide error free conveyed images when bit error rates (BERs) of 2% or more are experienced during image transmission.

As an alternative to the Huffman technique described above, a SEA-RL (Sequential Edge Addressing—Run Length) encoding technique involves:

(i) representing an image as a two colour (black-white) image in a two dimensional array of pixel elements;

(ii) partitioning the array into bands of single pixel element width and encoding each band in terms of colour transitions and run lengths relative to a reference end of the band to provide a corresponding data packet; and (iii) assembling the packets into a sequence of data wherein each packet is separated from its successive packet by EOL code data.

The SEA-RL technique was developed for improving transmission reliability when transmitting low resolution documents using very high frequency (VHF) radio communication apparatus arranged to transmit and receive modulated electromagnetic radiation in a frequency range of 30 MHz to 300 MHz. In the technique, run lengths correspond to sizes of groups of consecutive similar colour image pixel elements which are present in the bands. The data packets are not individually addressed in the sequence of data because relative addressing is employed where the data packets are arranged in the sequence in an order in which their respective bands are abuttable to form the image. A description of the SEA-RL technique is provided in a publication "Joint source-channel coding for raster document transmission over mobile radio" by Wyrwas and Farrell, IEE Proceedings, Vol. 136, Pt. I, No. 6 pp. 375–380, December 1989. The SEA-RL technique differs from other encoding techniques described above in that absolute rather than relative addressing of groups of image pixels is employed within each packet of data. Moreover, the technique is limited to communicating two tone black-white images only.

In the SEA-RL technique, EOL code data which punctuate data packets in a sequence are susceptible to transmission errors; corruption of EOL data may result in loss of individual packets or possibly loss of two successive packets. Due to their importance, EOL code data are therefore included in duplicate into the sequence. In a situation where one or more of the packets become corrupted in the sequence, entire retransmission of image data is required because relative addressing is employed for the packets. The SEA-RL technique is, in common with alternative techniques described above, based upon encoding an image as a series of bands to generate packets of data for transmission and is therefore heavily reliant on robustness of EOL codes punctuating each packet for coping with transmission errors. The reliance of the SEA-RL technique on its EOL symbols has proved in practice to be its major weakness, especially when bursts of interference corrupt SEA-RL encoded data and EOL codes incorporated therein.

In general, prior art approaches to encoding images described above all rely on:

(i) partitioning an image to be encoded into bands;

(ii) providing packets of data associated with each of these bands;

(iii) adding control information such as EOL and error control code data to each of the packets of data to provide composite data; and (iv) compressing the composite data.

They suffer from a problem that corruption of the control information within the compressed composite data causes extensive damage to an image reconstructed from the corrupted composite data. Interference giving rise to bit slips may also cause decoder synchronisation errors which results in incorrect data decoding of data subsequent to the bit slips, even when the subsequent data has not been corrupted.

It is an object of the invention to provide an alternative data encoding system.

According to the present invention, a data encoding system is provided incorporating encoding means for encoding input data including:

(a) analysing means for analysing the input data and generating corresponding digits; and (b) processing means for searching the digits to provide encoded output data, characterised in that (c) the analysing means is arranged to generate digits which are representative both of data distributions and of data occurrence probabilities; and (d) the processing means is arranged to select groupings of digits for use in generating the output data, thereby providing at least one of data compression in the output data and increasing its robustness to data corruption.

The invention provides the advantage that the encoding system provides one or both of data compression and increase in data robustness to corruption.

Moreover, EOL codes are not required in the encoded data and errors occurring during communication of an image through the system generally give rise to damage disseminated throughout the image when received and reconstructed rather than damage which is locally concentrated therein as observed in the prior art.

Damage disseminated generally throughout an image tends to render it more intelligible than localised damage to it because interpolation may be more easily applied to correct for the disseminated damage. Humans possess an eye-brain visual recognition system which is very good at discerning valid visual information imposed upon a noisy background and hence coping with damage disseminated throughout an image.

The encoding system may incorporate decoding means for decoding the encoded data, the means including:

(a) translating means for decoding the encoded data to provide groupings of digits which preserve information on data distributions and data occurrence probabilities encoded in the encoded data; and (b) interpreting means for interpreting the digits according to the occurrence probabilities to recreate the data in decoded form.

This provides an advantage that the input data received at the encoding means may be reconstructed at the decoding means from the encoded output data. As a consequence of encoding the input data by grouping digits, a need for EOL codes are not required. This provides an advantage that the system is able to recommence transmission of the data after disruption thereof without a need to abandon data which has already been successfully transmitted.

The system treats an image provided to it as a whole composition, dissecting it into a mosaic of variable geometry elements. An absolute address is associated with each element to provide data independence thereby allowing, for example, the elements to be interleaved with one another in the encoded data. The absolute address here defines spatial position of its associated element relative to a reference point for use when reconstructing the image.

The encoding system may be arranged to represent the input data in an array of digits and the processing means may be arranged to identify groupings of digits of mutually similar value in the array for use in generating the encoded output data. This provides an advantage of data compression in the output data by encoding groupings of digits of mutually similar value, and an advantage of being straightforward to implement, for example, in software implementing the encoding means.

The encoding system may be adapted to identify groupings of digits comprising digits which neighbour one another in the array for use in generating the output data. This provides an advantage of data compression in the output data.

The decoding means may be adapted to respond to corruption of digit grouping information in the encoded data received thereat by requesting selective retransmission of the digit grouping information and combining this information with previously received uncorrupted information for decoding the encoded data to recreate the data in decoded form. This provides a benefit that it is only necessary to retransmit the digit grouping information which has been corrupted during transmission from the encoding means to the decoding means rather than retransmitting the input data in entirety as undertaken in the prior art.

The processing means may be adapted to represent the digits in each grouping by a single corresponding grouping size parameter in the encoded output data. This provides an advantage of more efficient data compression in the output data.

The analysing means may be arranged to despeckle the input data represented by the array of digits by identifying isolated digits in the array whose associated values are dissimilar to those of neighbouring digits thereto and to modify the isolated digit values for at least one of increasing numbers of digits included in the groupings and decreasing the number of groupings required for representing the input data in the encoded output data. This provides a benefit of removing features in the input data which convey relatively little information and which result in reduced data compression in the encoded output data.

The analysing means may be arranged to partition the input data into a plurality of zones, and to despeckle digits corresponding to each zone by using a despeckling process preselected for that zone. This provides an advantage that zones incorporating non-critical information may, for example, be despeckled and thereby more efficiently data compressed in the encoded output data whereas zones which incorporate critical information may be un-despeckled and thereby be losslessly encoded into the encoded output data.

The processing means may be adapted to encode the groupings of digits into the encoded output data in an interleaved order corresponding to groupings with progressively smaller numbers of pixels therein, and the translating means may be adapted to check that groupings are encoded in an interleaved order in the encoded data for identifying that the groupings are uncorrupted. This provides a benefit that corrupted data may be identified when corruption has resulted in it being in non-interleaved order.

The translating means may be arranged to filter the encoded data for identifying incorrectly interleaved data therein and the interpreting means may be arranged to disregard the incorrectly interleaved data when recreating the data in decoded form. This provides an advantage that corrupted data which is not in an interleaved order is not used when recreating the data in decoded form.

The processing means may be adapted to search for digit groupings containing a number of digits, said number being in a predefined range, and encode them into the output data. This provides a benefit of providing a compromise between data compression and data resolution in the output data.

The analysing means may be adapted to represent each data distribution of the input data in corresponding digits using entropy encoding by assigning to at least some of the distributions relatively more or fewer digits with non-default values according to whether occurrence probability of the distribution within the input data is relatively higher or lower compared to that of other distributions, subject to each data distribution being unambiguously encoded into the output data by the processing means searching the digits. This provides enhanced data compression in the encoded output data.

The analysing means may be adapted to represent each data distribution of the input data using cluster encoding by assigning to at least some of the distributions relatively more or fewer digits with non-default values according to whether occurrence probability of the distribution within the input data is relatively higher or lower compared to that of other distributions, subject to:

(a) each data distribution being unambiguously encoded into the output data by the processing means searching the digits; and (b) each data distribution being represented by a corresponding digit combination which differs from that of data distributions most frequently occurring in combination with it by as few digit value differences as possible.

This provides an advantage of more efficient data compression in the encoded output data than that provided by entropy encoding.

The analysing means may be arranged to represent data distributions in the input data which occur most frequently by assigning it a default value and the processing means is arranged to (i) omit such default values when selecting digit groupings to be encoded into the output data for providing enhanced data compression; and (ii) include header information in the output data defining the data distribution which occurs most frequently;

and the decoding means is arranged to recreate the data distributions which occur most frequently from the header information data when recreating the output data in decoded form. This enhances data compression.

The processing means may be arranged to apply additional Reed-Muller encoding to the encoded output data, and the translating means is adapted to decode the Reed-Muller encoded data by using trellis decoding means. This provides greater robustness of the encoded output data against corruption.

The processing means may be adapted to incorporate one or more synchronisation codes into the encoded data for assisting resynchronisation of the translating means to the data after loss or absence of synchronisation. This provides an advantage of improved synchronisation when decoding the encoded output data.

The analysing means may be adapted to analyse input data comprising image colour information and to incorporate the information into the digits, the processing means may be adapted to select groupings of the digits for use for providing encoded output data incorporating the colour information, and the decoding means may be adapted to receive the encoded data incorporating colour information, decode it and recreate from it the input data including its colour information. This provides an advantage that the system may be used for communicating colour images, for example where the system is incorporated into a colour facsimile system.

The analysing means may incorporate digit estimating means for estimating occurrence of neighbouring digits occurring in association with groupings of digits selected by the processing means which neighbour onto one another and the processing means may be adapted to include estimation parameters in the encoded output data indicative of the neighbouring digits, and the decoding means may be adapted to decode encoded data incorporating estimation parameters and estimate therefrom presence of neighbouring digits for use in recreating the data.

In another aspect, the invention provides a method of encoding input data in a data encoding system to provide encoded output data, the encoding system incorporating analysing means for analysing the input data and representing it in terms of digits, and processing means for processing the digits to generate the output data, and the method including the steps of:

(a) performing a frequency analysis on the input data to represent both data distributions and data occurrence probabilities in terms of digits to obtain at least one of data compression and increased corruption robustness; and (b) processing the digits to select groupings of digits for use in generating the output data.

In order that the invention might be more fully understood, embodiments thereof will now be described, by way of example only, with reference to accompanying drawings in which:

FIG. 4 is a diagram of processing stages of a trellis decoding routine.

Figure 1:
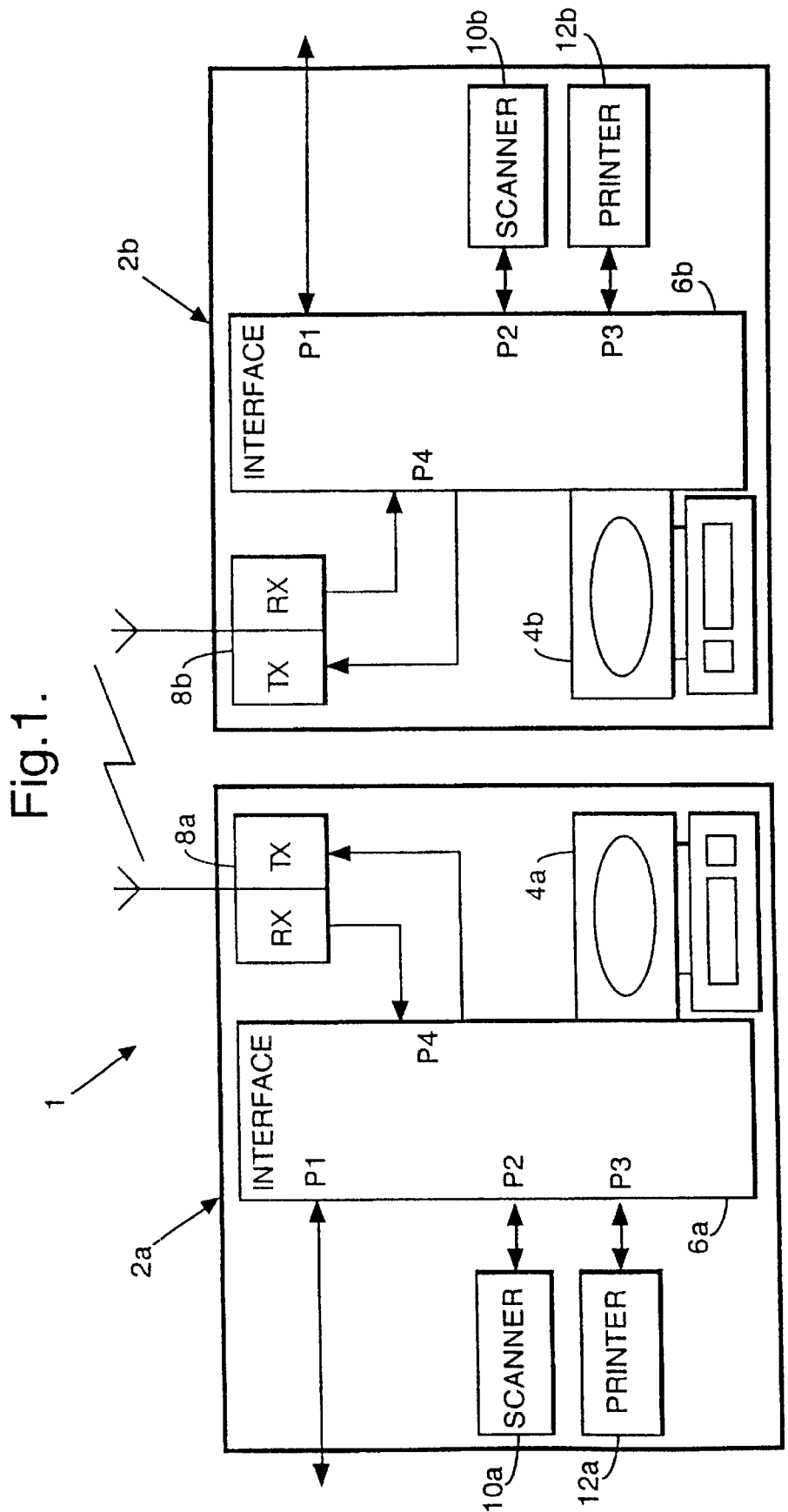
FIG. 1 is a schematic diagram of a data encoding system of the invention.

In FIG. 1 there is shown a schematic diagram of a data encoding system of the invention indicated generally by 1. It incorporates two communication stations 2a, 2b. The station 2a comprises an IBM compatible personal computer 4a incorporating a Pentium processor and a random access memory for storing data, an RS232 interface module 6a incorporating four bi-directional communication ports P1–4, a Rockwell-Collins HF9000 radio transceiver 8a, a paper document scanner 10a and a laser printer 12a. The scanner 10a and the printer 12a are standard commercially available proprietary products compatible with the computer 4a. The module 6a incorporates a proprietary 5710 Modem which is manufactured by a company Harris Inc. "Pentium" is a registered trade mark of Intel Corporation. "IBM" is an abbreviation for International Business Machines Inc. The station 2b is equivalent to the station 2a and incorporates like-referenced items 4b, 6b, 8b, 10b, 12b which are suffixed b instead of a. The radio transceivers 8a, 8b are arranged to provide bi-directional voice and RS232 communication between the station 2a, 2b by receiving and emitting electromagnetic radio radiation in a frequency range of 3 to 30 MHz; the transceivers 8a, 8b are arranged to provide a 3 kHz communication frequency bandwidth. RS232 communication is provided via the transceivers 8a, 8a by frequency shift keying or tone phase modulation techniques which are well known to those skilled in communication system design.

In the station 2a, the computer 4a is connected to the module 6a. The ports P1 to P1 P4 are connected to external equipment (not shown), to the scanner 10a, to the printer 12a and to an RS232 communication port of the transceiver 8a respectively. Identical interconnection is employed for equivalent like-referenced items in the station 2b which are suffixed b instead of a.

Operation of the encoding system 1 will now be described. The scanner 10a scans a document bearing an image presented to it to provide a stream of data describing spatial and colour detail of the image and sends the stream to the port P2 of the module 6a. The module 6a conveys the data from the port P2 to the computer 4a which stores it in its random access memory. The computer 4a performs a series of encoding functions upon the data to encode it and thereby generate a sequence of pixel data within its memory. The series of functions will be explained in more detail later. The computer 4a then sends the sequence of data via the port P4 of the module 6a to the transceiver 8a which transmits it as electromagnetic radiation at preselected frequencies in a range of 3 to 30 MHz.

The transceiver 8b receives the radiation and demodulates the sequence of data from it and then sends the sequence to the port P4 of the module 6b. The sequence passes from the port P4 through the module 6b to the computer 4b which stores it in its random access memory. The computer 4b then performs a series of decoding functions on the sequence to generate reconstructed image data in its memory. These decoding functions will be explained in more detail later. The computer 4b then outputs the image data through the port P3 of the module 6b to the printer 12b which produces a paper printout of the image.

The system 1 is also arranged to communicate one or more images input to the scanner 10b to the printer 12a in an identical manner to that described above except that items suffixed a and b are suffixed b and a respectively. Bi-directional image communication between the stations 2a, 2b is thereby provided. The modules 6a, 6b are also arranged to receive image data from external equipment (not shown) at the port P1 of the modules 6a, 6b for communication via the computers 4a, 4b and the transceivers 8a, 8b respectively as encoded picture element data. Moreover, the modules 6a, 6b are also arranged to send decoded image data from the computers 4a, 4b respectively through the port P1 to the external equipment.

Figure 2:
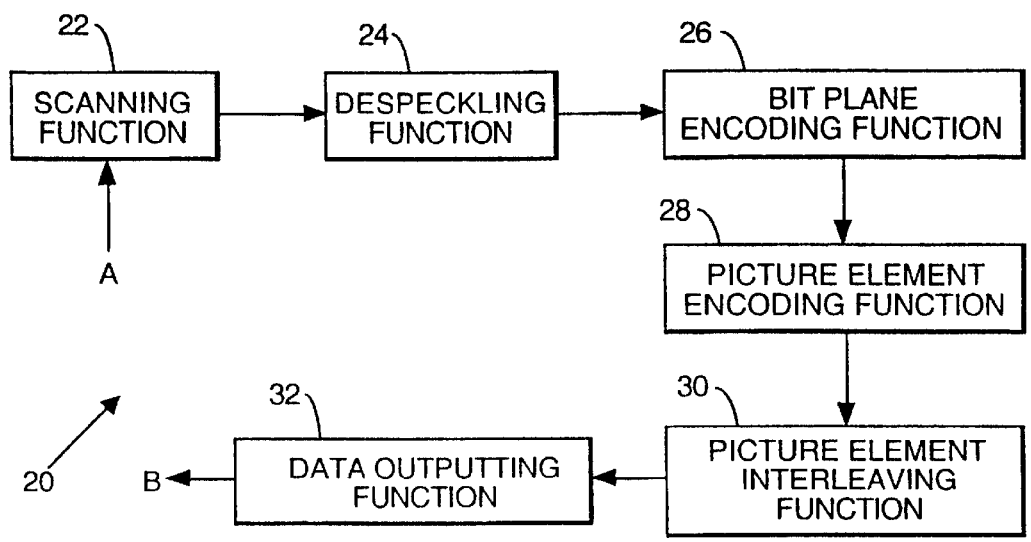
FIG. 2 illustrates a series of encoding functions employed in the system in FIG. 1.

Referring to FIG. 2, a series of encoding functions executable within the system 1 in FIG. 1 is indicated generally by 20. The series 20 comprises in order a scanning function 22, a despeckling function 24, a bit plane encoding function 26, a picture element encoding function 28, a picture element interleaving function 30 and a data outputting function 32. The series of functions 20 is executable by the computers 4a, 4b on input image data, namely image data A, stored in their memory to provide data, namely data B, suitable for communication via the transceivers 8a, 8b respectively.

The operation of the series 20 will now be explained with reference to FIGS. 1 and 2 for an image input at the station 2a and communicated to the station 2b for reconstruction there. As the two stations 2a, 2b are equivalent, a similar operation is undertaken for an image input at the station 2b and communicated to the station 2a for reconstruction there except that the suffixes a and b are substituted for one another.

An image is input as image data A to the computer 4a which stores the data in its memory. The data corresponds to a description of colour at spatial locations within a rectangular image field containing the image. The image is abutted to a first corner of the field as represented in the data A. The scanning function 22 operates on the data A to generate data corresponding to an array of 2000 by 2000 pixels $P_{i,j}$ representing the image field where i and j are indices in a range of 1 to 2000. The indices i and j monotonically correspond respectively to spatial locations along x and y axes of a Cartesian frame incorporating the image field and thereby together identify a grid of regularly spaced locations within the field. Thus a pixel $P_{1,1}$ corresponds to a first corner of the image field and a pixel $P_{2000, 2000}$ corresponds to a second corner of the field which is diagonally opposite the first corner. Moreover a pixel $P_{1000, 1000}$ corresponds to a central location in the image field. Each pixel $P_{i,j}$ describes image colour at a location identified by the indices i and j and P is numerically in a range of 1 to 16; thus, the scanning function 22 quantizes shade and colour in the image into a monotonic scale comprising sixteen colour shades in a range from black to white. It is advantageous to represent the image as the array of pixels $P_{i,j}$ because subsequent processing of pixel data is straightforward to arrange in software.

The despeckling function 24 operates on the array of pixels $P_{i,j}$ to identify and modify pixels therein which correspond to isolated regions of the image which have a colour substantially different from surrounding regions to them in the image, namely pixels $P_{i,j}$ corresponding to speckle in the image. As will be explained later, the function 24 provides an advantage of removing image features which convey relatively little information and which result in inefficient data compression when applying the encoding function 28. The function 24 is also effective at removing unwanted image noise introduced through digitisation inaccuracies, for example when images are scanned in the scanner 10a or where incorrect image quantization has occurred.

The function 24 is arranged to operate in any one of three preselected despeckling modes, namely mode 1, mode 2 and mode 3. These three modes provide a choice of despeckling characteristic and are preselectable depending upon, for example, image content.

In mode 1, each pixel $P_{i,j}$ is mapped as described in this paragraph onto a corresponding pixel in an array $Q_{i,j}$ by operation of the function 24. Each pixel $P_{i,j}$ is compared with its eight neighbouring pixels, namely pixels $P_{k,l}$ where an index k is in a range of i−1 to i+1, an index l is in a range of j−1 to j+1, and the indices k and l are not both simultaneously equal to the indices i and j respectively. If the neighbouring pixels $P_{k,l}$ are all of an identical value to one another and to the pixel $P_{i,j}$ the pixel $Q_{i,j}$ is assigned a value of the pixel $P_{i,j}$. If the neighbouring pixels $P_{k,l}$ are all of identical value to one another but different from the pixel $P_{i,j}$, the pixel $Q_{i,j}$ is assigned the value of the pixels $P_{k,l}$. In a situation where only seven of the neighbouring pixels $P_{k,l}$ are of identical value to one another, the pixel $Q_{i,j}$ is assigned the value of the pixel $P_{i,j}$ if a preselected threshold is set to a value eight. However, if the threshold is set to a value seven in this situation, the function 24 compares the pixel $P_{i,j}$ with its nearest twenty four surrounding pixels, namely pixels $P_{a,b}$ where an index a is in a range of i−2 to i+2, an index b is in a range of j−2 to j+2 and the indices a and b are not both simultaneously equal to the indices i and j respectively. If more than twenty one of these neighbouring pixels $P_{a,b}$ are of an identical value to one another, the pixel $Q_{i,j}$ is assigned this identical value, otherwise the pixel $Q_{i,j}$ is assigned a preselected default value. Mode 1 provides an advantage that many neighbouring pixels may be taken into consideration when deciding an appropriate value for the pixel $Q_{i,j}$.

In mode 2, each pixel $P_{i,j}$ is mapped onto a corresponding pixel $Q_{i,j}$ by operation of the despeckling function 24 as described in this paragraph. Each pixel $P_{i,j}$ is compared with its four immediate neighbouring pixels $P_{i-1,j}$, $P_{i+1,j}$, $P_{i,j-1}$ and $P_{i,j+1}$. If the neighbouring pixels and the pixel $P_{i,j}$ are all of identical value to one another, the pixel $Q_{i,j}$ is assigned an identical value to that of the pixel $P_{i,j}$. However, if the neighbouring pixels are of an identical value to one another but different to that of the pixel $P_{i,j}$, the pixel $Q_{i,j}$ is assigned this identical value. Mode 2 provides an advantage of being a simple and fast method of despeckling image data. Moreover, it also provides an advantage that colour run-lengths in the pixels $Q_{i,j}$ become extended which improves data compression performance of the system 1.

In mode 3, each pixel $P_{i,j}$ is mapped onto a corresponding pixel $Q_{i,j}$ by operation of the despeckling function 24 as described in this paragraph. Each pixel $P_{i,j}$ is compared with its two neighbouring pixels $P_{i-1,j}$ and $P_{i+1,j}$, referred to as horizontal pixels. If the pixel $P_{i,j}$ and its horizontal pixels are of identical value to one another, the pixel $Q_{i,j}$ is assigned this identical value. If the horizontal pixels are of an identical value to one another which is different from that of the pixel $P_{i,j}$, the pixel $Q_{i,j}$ is assigned the identical value. In a situation where the horizontal pixels are not of an identical value to one another, the pixel $P_{i,j}$ is compared to its neighbouring pixels $P_{i,j+1}$ and $P_{i,j-1}$, referred to as vertical pixels. In this situation, if the vertical pixels are of an identical value to one another which is different to that of the pixel $P_{i,j}$, the pixel $Q_{i,j}$ is assigned this identical value. Alternatively in this situation, the pixel $Q_{i,j}$ is assigned a value of the pixel $P_{i,j}$ if the vertical pixels are of different value to one another. Mode 3 provides an advantage of creating larger groups of neighbouring pixels $Q_{i,j}$ of identical value to one another in the array which results in more efficient subsequent data compression than when modes 1 and 2 are employed.

Compared to the data communicated non-despeckled through the system 1, modes 1 and 2 provide typically 5% increased data compression whereas mode 3 provides typically 25% increased data compression. The system 1 is configured so that despeckling of the pixels $P_{i,j}$ is optional; when despeckling of the pixels $P_{i,j}$ is not selected, the pixels $P_{i,j}$, are translated directly onto their corresponding pixels $Q_{i,j}$, namely $Q_{i,j}=P_{i,j}$.

The despeckling function 24 is configurable so that only preselected regions, for example preselected by a user of the system 1, of the image input to the computer 4a are despeckled. Moreover, it is configurable to apply a preferred preselected mode to certain regions of the image, for example a border region of the image may be despeckled using mode 1 whereas a central region of it may be despeckled using mode 3. This selective use of the modes is known as zone despeckling. As an example where zone despeckling is appropriate, technical drawings often have edge margins which contain negligible information and a central region which contains critical information. In this example, despeckling is appropriately applied to the edge margins but not to the central region. Zone despeckling provides an advantage that a user of the image communication system 1 may choose a compromise between data compression and useful image detail conveyed through it.

On completion of the despeckling function 24, the bit plane encoding function 26 operates on the pixels $Q_{i,j}$ to determine frequency of occurrence of pixel colour. This is performed so that colours which occur most frequently in the image are communicated in the system 1 by parameters in the data B which contain relatively few bits, thereby contributing to data compression.

The function 26 introduces an array of sixteen elements $F_y$ which are preset to zero. The elements $F_y$ each correspond to one of the sixteen colours, thus $F_1$ corresponds to one colour and $F_2$ corresponds to another colour and so on. The function 26 searches in sequence through the pixels $Q_{i,j}$ and for each pixel searched increments the element $F_y$ where an index y is identical in value to the numerical value of the pixel $Q_{i,j}$ searched, namely its pixel colour. This search provides a frequency distribution in the elements $F_y$ of occurrence of colour in the pixels $Q_{i,j}$.

The function 26 then introduces an array of sixteen elements $G_z$ where the element $G_1$ is assigned a value of the index y for the element $F_y$ of greatest value, $G_2$ is assigned a value of the index y for the element $F_y$ of next greatest value, and so on. This provides a ranking order of occurrence of the colours in the image.

The function 26 then performs a bit plane translation routine which maps each pixel $Q_{i,j}$ onto corresponding pixels in four bit plane arrays $BQ_{i,j,r}$ where a bit plane index r is in a range 1 to 4. The routine searches for each pixel $Q_{i,j}$ through the array of elements $G_z$ to find an element $G_w$ therein of identical numerical value to it, and then assigns values of zero or unity depending upon the index w to the corresponding pixels $BQ_{i,j,r}$ according to an entropy encoding relationship provided in Table 1. Entropy encoding is known in the prior art and is not limited to four bits as illustrated in Table 1. Entropy encoding is distinguishable from other types of encoding, for example where the pixels $BQ_{i,j,r}$ are allocated with binary values corresponding directly to the value of their corresponding pixel $Q_{i,j}$ in that:

(i) increasing values of the index w are encoded as progressively more pixels $BQ_{i,j,r}$ being assigned a logic value 1 from their default value logic 0, subject to (ii) as few pixels $BQ_{i,j,r}$ being assigned to logic value 1 as possible whilst ensuring each value of w is encoded unambiguously in these pixels $BQ_{i,j,r}$ with respect to other values of w encoded therein.

Entropy encoding provides an advantage that information conveyed in the pixels $Q_{i,j}$ is more equally distributed between the pixels $BQ_{i,j,r}$ in the bit plane arrays. Moreover, entropy encoding also provides an advantage of potential data compression; data compression in the system 1 is found in practice to be enhanced by approximately 45% compared to an implementation of the system where the pixels $BQ_{i,j,r}$ are allocated binary values of their corresponding pixel $Q_{i,j}$ values directly.

TABLE 1

| Index w value | $BQ_{i,j,1}$ | $BQ_{i,j,2}$ | $BQ_{i,j,3}$ | $BQ_{i,j,4}$ |
| --- | --- | --- | --- | --- |
| 1 | 0 | 0 | 0 | 0 |
| 2 | 0 | 0 | 0 | 1 |
| 3 | 0 | 0 | 1 | 0 |
| 4 | 0 | 1 | 0 | 0 |
| 5 | 1 | 0 | 0 | 0 |
| 6 | 0 | 0 | 1 | 1 |
| 7 | 1 | 1 | 0 | 0 |
| 8 | 1 | 0 | 0 | 1 |
| 9 | 0 | 1 | 1 | 0 |
| 10 | 0 | 1 | 0 | 1 |
| 11 | 1 | 0 | 1 | 0 |
| 12 | 0 | 1 | 1 | 1 |
| 13 | 1 | 1 | 1 | 0 |
| 14 | 1 | 0 | 1 | 1 |
| 15 | 1 | 1 | 0 | 1 |
| 16 | 1 | 1 | 1 | 1 |

Thus, the routine has an effect of mapping the array of pixels $Q_{i,j}$ onto the four bit plane arrays of pixels $BQ_{i,j,r}$ depending upon colour values of the pixels $Q_{i,j}$. It provides an advantage that the pixels in the bit plane arrays are of logic values 0 and 1 only which are efficient to manipulate in software. Moreover, it provides an additional advantage that pixel colours which occur most frequently in the image are communicated in the data B by relatively few bits set to logic 1 thereby ensuring efficient data compression, for example a pixel $Q_{i,j}$ of most frequently occurring colour corresponding to w=1 is represented by $BQ_{i,j,1}=0$, $BQ_{i,j,2}=0$, $BQ_{i,j,3}=0$ and $BQ_{i,j,4}=0$ in the bit plane arrays; the colour corresponding to w=1 is designated as a default colour because none of the pixels $BQ_{i,j,r}$ for it are set to logic 1.

The encoding function 26 then transfers the bit plane arrays of pixels $BQ_{i,j,r}$ to the picture element encoding function 28. The function 28 examines them in sequence of ascending index r value repeatedly for all values of the indices i and j to identify progressively smaller groupings of neighbouring pixels of logic 1 value therein and then encodes them as square and run length picture elements which define position and size of the groupings within the bit plane arrays $BQ_{i,j,r}$. The picture elements are recorded in the memory of the computer 4a. The function 28 comprises two routines which are performed in sequence, namely a square picture element extraction routine and a run length extraction routine.

The encoding function 28 commences with the square element extraction routine which operates on the pixels $BQ_{i,j,r}$ to represent them as square picture elements. The picture elements are described by arrays of square position elements $X_{n,r}$ and $Y_{n,r}$ and an array of square size elements $S_{n,r}$ where n is a square picture element identifying index and r is the bit plane index. Maximum and minimum group size limits $M_u$ and $M_l$ are preselected according to desired resolution prior to invoking the square element extraction routine. It is found satisfactory in practice to preselect the limits $M_u$ and $M_l$ to 22 and 3 pixels respectively; however, other values are pre-assignable to these limits.

A value for the limit $M_u$ is also selectable by a user of the system 1 to suit anticipated degree of corruption of the sequence of data when transmitted through the system 1; a greater value of the limit $M_u$ will result in correspondingly greater values for the larger square elements $S_{n,r}$ where loss of information associated with those larger valued elements in an event of data corruption will more seriously disfigure an image reconstituted from the data. Conversely, a lower value of the limit $M_u$ will result in less efficient data compression thereby increasing data transmission duration during which interference may be encountered.

The square element extraction routine performs the following steps:

(i) All the pixels $BQ_{i,j,r}$ are initially designated as enabled for purposes of picture element encoding and the index r is set to unity;

(ii) The index n and a searching parameter $M_s$ are initially assigned values of unity and the limit $M_u$ respectively;

(iii) The routine searches through the pixels $BQ_{i,j,r}$ to identify a grouping of neighbouring enabled pixels $BQ_{f,g,r}$ assigned a logic 1 by the bit plane translation routine where f is an index in a range of i to $i+M_s$ and g is an index in a range of j to $j+M_s$;

(iv) When a grouping in step (iii) above is found, the elements $X_{n,r}$ and $Y_{n,r}$ are assigned values of the indices i and j respectively, the element $S_{n,r}$ is assigned a value of the parameter $M_s$ and the enabled pixels $BQ_{f,g,r}$ are then disabled so that they are not considered in further searches;

(v) The index n is incremented and steps (iii) and (iv) above repeated until all the pixels $BQ_{i,j,r}$ in the array have been searched;

(vi) The parameter $M_s$ is then decremented by a preselected amount and the steps (iii) to (v) are repeated until the parameter $M_s$ has been decremented to a value of less than the limit $M_l$;

(vii) The index r is then incremented and steps (ii) to (vi) repeated until it is greater than a value four.

The parameter $M_s$ is decremented by not more than twenty times from the limit $M_u$ to the limit $M_l$ in the routine described above. Its values are recorded in an array of elements $T_a$ where the subscript index a is in a range of one to twenty.

This square extraction routine, in combination with the run length extraction routine, provides data compression for most types of image, where data compression in this case relates to the number of elements $X_{n,r}$, $Y_{n,r}$ and $S_{n,r}$ designated compared to the number of pixels $BQ_{i,j,r}$. Representation of the image as square element groupings provides an advantage that only one size parameter is required to describe each grouping, namely the elements $S_{n,r}$, on account of square symmetry whereas other shapes of element groupings such as rectangles of non-equal pixel side length may require two or more size parameters to describe them; thus, the use of a square element groupings provides particularly efficient data compression in the system 1.

On completion of the square element extraction routine described above, there are often residual enabled pixels $BQ_{i,j,r}$ which are not represented in the elements $X_{n,r}$, $Y_{n,r}$ and $S_{n,r}$ if the limit $M_l$ is preselected to be greater than unity. All the pixels $BQ_{i,j,r}$ are represented in the elements $X_{n,r}$, $Y_{n,r}$ and $S_{n,r}$ when the limit $M_l$ is preselected to be unity. These residual enabled pixels $BQ_{i,j,r}$, known as residual images, form groupings which are known as run lengths which correspond to lines in the image which are narrower than an analogous lower size limit imposed by the limit $M_l$.

The encoding function 28 then performs the run length extraction routine on the residual enabled pixels $BQ_{i,j,r}$. Horizontal run length arrays of position elements $Xh_{m,r}$, $Yh_{m,r}$ and length elements $Sh_{m,r}$ are employed to describe identified groupings of neighbouring enabled pixels $BQ_{i,j,r}$ of logic 1 value which have an identical j and r index values. Vertical run length arrays of position elements $Xv_{q,r}$, $Yv_{q,r}$ and length elements $Sv_{q,r}$ are employed to describe identified groupings of neighbouring enabled pixels $BQ_{q,r}$ of logic 1 value which have identical i and r index values. Preselected upper and lower limits, namely $R_u$ and $R_l$ respectively, determine sizes of groupings of neighbouring enabled pixels of unity value searched for by this routine. It is found in practice that preselecting the limits $R_u$ and $R_l$ to values sixteen and two respectively provides satisfactory operation of the system 1; however, other values may be assigned to the limits $R_u$ and $R_l$ depending upon desired resolution. For example, every element is encoded when the limit $R_l$ is assigned a value of unity and the system 1 is then said to be lossless.

The run length routine performs the following steps:

(i) The index r is set to a value of unity;

(ii) Indices m and q are set to unity. A searching parameter $R_s$ is set to the limit $R_u$;

(iii) The routine searches through the residual enabled pixels $BQ_{i,j,r}$ from the pixel $BQ_{i,j,r}$ to the pixel $BQ_{i+Rs,j,r}$ to identify a grouping of neighbouring enabled pixels of logic 1 value;

(iv) If a grouping is found in step (iii), the elements $Xh_{m,r}$ and $Yh_{m,r}$ are assigned values of the indices i and j respectively and the element $Sh_{m,r}$ is assigned the value of the parameter $R_s$. The pixels $BQ_{i,j,r}$ to $BQ_{i+Rs,j,r}$ in the grouping are then disabled so that they are not considered in further searches and the index m is incremented;

(v) The pixels $BQ_{i,j,r}$ are searched to identify a grouping of neighbouring enabled pixels from $BQ_{i,j,r}$ to $Q_{i,j+RS,r}$ of logic 1 value;

(vi) If a grouping is found in step (v), the elements $Xv_{q,r}$ and $Yv_{q,r}$ are assigned values of the indices i and j respectively, the element $Sv_{q,r}$ is assigned the value of the parameter $R_s$. The pixels $BQ_{i,j,r}$ to $BQ_{i,j+Rs,r}$ are then disabled so that they are not considered in further searches and the index q is incremented;

(vii) The steps (iii) to (vi) above are repeated until all the pixels $BQ_{i,j,r}$ have been searched;

(viii) The parameter $R_s$ is then decremented by a preselected amount and the steps (iii) to (vii) repeated until the parameter $R_s$ is decremented so that its value is less than the limit $R_l$;

(ix) The index r is then incremented and steps (ii) to (viii) repeated until it is greater than a value four.

A first pixel $BQ_{i,j,r}$ is defined as neighbouring other pixels $BQ_{i,j,r}$ when the indices i, j of the first pixel differ from those of the other pixels by one count only, for example:

(i) a pixel $BQ_{3,4,2}$ neighbours a pixel $BQ_{4,4,2}$;

(ii) a pixel $BQ_{5,6,2}$ neighbours a pixel $BQ_{4,5,2}$; and (iii) pixels $BQ_{6,7,3}$, $BQ_{7,7,3}$, $BQ_{6,8,3}$ and $BQ_{7,8,3}$ are a group of four pixles which neighbour one another.

The parameter $R_s$ is arranged to be decremented by not more than ten times from the limits $R_u$ to $R_l$ in the routine described above. Its values are recorded in an array of elements $U_b$ where an index b is in a range of one to ten.

Any remaining residual enabled pixels $BQ_{i,j,r}$ which are not represented in the elements $X_{n,r}$, $Y_{n,r}$, $S_{n,r}$, $xh_{m,r}$, $Yh_{m,r}$, $Sh_{m,r}$, $Xv_{q,r}$, $Yv_{q,r}$ and $Sv_{q,r}$ do not become encoded by the encoding function 28. If there are any residual enabled pixels $BQ_{i,j,r}$ which are not encoded by the encoding function 28, the system 1 is defined as being lossy regarding information flow therethrough. Alternatively, if all enable pixels $BQ_{i,j,r}$ become encoded by the function, the system 1 is defined as being lossless.

The encoding function 28 thus operates on the pixels $BQ_{i,j,r}$ to generate the elements $X_{n,r}$, $Y_{n,r}$, $S_{n,r}$, $Xh_{m,r}$, $Yh_{m,r}$, $Sh_{m,r}$, $Xv_{q,r}$, $Yv_{q,r}$, and $Sv_{q,r}$ which represent the image input to the computer 4a after despeckling in the function 24 in compressed form as a list of picture elements. This list provides an advantage of constituting less information to be communicated when sending images from the station 2a to the station 2b, and hence reduced transmission duration, in comparison to communicating images by sending the array of pixels $Q_{i,j}$.

For further clarifying operation of the system 1, application of the functions 22 to 28 can be summarised as:

(i) representing the image input in the memory of the computer 4a as a two dimensional array of 2000 by 2000 pixels in which the pixels are numerically in a value range of one to sixteen representing sixteen colours in the image;

(ii) reducing speckle in the array;

(iii) undertaking an analysis of the array to determine frequency of occurrence of the colours;

(iv) mapping each of the pixels depending upon its colour and frequency of occurrence of its colour within the image onto a number of parallel logic pixel arrays;

(v) searching the logic arrays for square groupings of neighbouring pixels of logic 1 value therein and representing each identified square grouping in picture element arrays in the memory in which each grouping is defined therein by position and size parameters, and then disabling the pixels in the identified grouping in the logic arrays from consideration in successive searches;

(vi) repeating step (v) above in descending order of grouping size until a lower size limit for the grouping size is reached;

(vii) searching the logic arrays for residual run length pixel groupings of unity pixel width, which have not been recorded in steps (v) to (vi), and representing each identified run length grouping in picture element arrays in the memory where each grouping is defined therein by position and length parameters, and then disabling the pixels in the identified grouping in the logic array from consideration in successive searches;

(viii) repeating step (vii) above in descending order of run length size until a lower size limit for the grouping is reached.

A compression factor K describes data compression obtainable from the encoding function 28 when mapping information in the bit plane arrays of pixels $BQ_{i,j,r}$ into the picture elements $X_{n,r}$, $Y_{n,r}$, $S_{n,r}$, $Xh_{m,r}$, $Yh_{m,r}$, $Sh_{m,r}$, $Xv_{q,r}$, $Yv_{q,r}$ and $Sv_{q,r}$. This factor K is calculable using equation [1]:

$$K = \left(\frac{2c}{x_p y_p}\right)\left(1 + \frac{2}{F}\right)\left[\sum_{S=M_t}^{S=M_s} n_S + \sum_{H=R_t}^{H=R_M} n_H + \sum_{V=R_t}^{V=R_W} n_V\right] \quad [1]$$

where $x_p$=x axis length of the image field (in pixels);

$y_p$=y axis length of the image field (in pixels);

$M_u$=maximum square picture element size limit (in pixels);

$M_l$=minimum square picture element size limit (in pixels);

$n_H$=number of run lengths of a length H (in pixels) parallel to the x axis;

$n_V$=number of run lengths of a length V (in pixels) parallel to the y axis;

$n_S$=number of square picture elements of size S (in pixels);

$R_u$=limit for maximum number of pixels in a run length (in pixels);

$R_l$=limit for minimum number of pixels in a run length (in pixels);

c=number of binary bits required to express $x_p$ or $y_p$ in terms of number of pixels;

F=frequency of synchronisation code word insertion.

When encoding real images in practice, for example maps and aerial photographs, the compression factor K is found to be greatest when the limit $M_l$ is preselected to be three or four pixels. In the system 1, the limit $M_l$ is thus preselected to be three pixels. For an array of 2000 by 2000 pixels, twenty two bits of information are required for identifying a pixel uniquely; thus, the parameter c in equation [1] is eleven bits.

On completion of the encoding function 28, the interleaving function 30 operates on the square elements $X_{n,r}$, $Y_{n,r}$ and $S_{n,r}$, on the horizontal run length elements $Xh_{m,r}$, $Yh_{m,r}$ and $Sh_{m,r}$, and on the vertical run length elements $Xv_{q,r}$, $Yv_{q,r}$ and $Sv_{q,r}$ provided from the function 28 to reorder them and thereby generate an interleaved series of elements in which the elements $S_{n,r}$, $Sh_{m,r}$ and $Sv_{q,r}$ appear in decreasing order of size with their associated elements $X_{n,r}$, $Y_{n,r}$, $Xh_{m,r}$, $Yh_{m,r}$, and $Xv_{q,r}$, $Yv_{q,r}$ respectively, namely larger picture elements appear earlier in the series than smaller picture elements irrespective of their bit plane index r value. When several elements $S_{n,r}$, $Sh_{m,r}$, $Sv_{q,r}$ of equal value to one another occur contiguously in the series, they are arranged in the series in ascending order of their corresponding $Y_{n,r}$, $Yh_{m,r}$, $Yv_{q,r}$ element values in the series. Moreover, when several elements $S_{n,r}$, $Sh_{m,r}$, $Sv_{q,r}$ of equal value to one another occur contiguously in the series and also have equal corresponding $Y_{n,r}$, $Yh_{m,r}$, $Yv_{q,r}$ element values to one another, they are arranged in ascending order of $X_{n,r}$, $Xh_{m,r}$, $Xv_{q,r}$ element values in the series.

This interleaved order is retained in the data B and provides an advantage that any inconsistency in the order detected at the receiving station 2b will indicate occurrence of data corruption which is correctable in the system 1 by, for example, requesting retransmission of the elements which have been corrupted. In the data B, the square picture elements are listed first in the series followed by the horizontal run length elements and finally the vertical run length elements.

The arrays of elements $T_a$ and $U_b$ are incorporated into the data B and enables efficient encoding to be achieved using frame symbols contained in the data which refer to these elements.

The outputting function 32 operates on the interleaved series of elements input to it from the function 30 to assemble the data B for communication via the transceiver 8a. The data B comprises a series of data words, each comprising 11 bits, which is arranged to convey information in a following sequence:

(i) image header information declaring a format for the data B and incorporating the elements $T_a$, $U_b$ and $G_z$ (first time);

(ii) the square picture elements described by frame symbols referring to size values conveyed in the elements $T_a$ incorporated into the header information and by the elements $X_{n,r}$ and $Y_{n,r}$ commencing with picture elements of larger size values and ending with picture elements of smaller size values;

(iv) image header information declaring a format for the data B and incorporating the elements $T_a$, $U_b$ and $G_z$ (second time);

(v) horizontal run length elements described by frame symbols referring to size values conveyed in the elements $U_b$ incorporated into the header information and by the elements $Xh_{m,r}$ and $Yh_{m,r}$ commencing with larger run length elements of larger size values and ending with run length elements of smaller size values;

(vi) vertical run length elements described by frame symbols the elements $Xv_{q,r}$ and $Yv_{q,r}$ commencing with run length elements of larger value and ending with run length elements of smaller value; and (vii) image header information declaring a format for the data B and incorporating the elements $T_a$, $U_b$ and $G_z$ (third time).

The square picture elements, the horizontal run length elements, the vertical run length elements and the elements $T_a$, $U_b$ and $G_z$ are accompanied by frame symbols in the data B. The elements $G_z$, referred to as a palette table, are essential information in the data B for converting the elements represented in the data B into colour shade information present in the pixels $Q_{i,j}$ during subsequent image reconstruction at the station 2b. The elements $T_a$ and $U_b$ are essential information for interpreting frame symbols in the data B and thereby determining grouping sizes. The outputting function 32 is preconfigurable to apply 16:11:4 Reed-Muller encoding to the elements $X_{n,r}$, $Y_{n,r}$, $Xh_{m,r}$, $Yh_{m,r}$, $Xv_{q,r}$, $Yv_{q,r}$ in data B prior to sending it to the transceiver 8a. When the 16:11:4 Reed-Muller encoding is applied, five additional data bits are added to each data word in the data B thereby encoded so that each data word of 11 bits is represented by 16 bits when encoded. Incorporation of the Reed-Muller encoding provides an advantage of increased data robustness which enables, for example, bit error rates in excess of 1 error bit in 50 bits, for example, to be withstood by the system 1.

However, data compression provided by the system 1 is reduced when Reed-Muller encoding is employed as a consequence of including the additional bits in the data B.

In order to further explain operation of the outputting function 32, Reed-Muller encoding will now be described in more detail. Reed-Muller encoding of data words involves adding additional encoding bits to the words to increase their robustness to corruption. For example, if a 9-bit data word in data B is represented by a matrix H:

$$H=[h_9,h_8,h_7,h_6,h_5,h_4,h_3,h_2,h_1] \qquad \text{Eq. 2}$$

where $h_9$ is a most significant bit of the word and $h_1$ is a least significant bit of the word, then a 16-bit 16:11:4 Reed-Muller encoded version of H is given by a matrix $H_{RM}$:

$$H_{RM}=[h_{10}\oplus h_{11}\oplus c_4, h_{11}\oplus c_3, h_{11}\oplus c_2, h_{11}\oplus c_1, h_{10}\oplus b_3, h_9, h_8, h_7, h_{10}\oplus b_2, h_6, h_5, h_4, h_{10}\oplus b_1, h_3, h_2, h_1] \qquad \text{Eq. 3}$$

where $c_1$ to $c_4$=encoding coefficients;

$b_1$ to $b_3$=encoding coefficients; and $h_{10}$, $h_{11}$=additional encoding data bits.

Thus, the words H in the data B are encoded to provide corresponding words $H_{RM}$ which are supplied for transmission instead of the word H when Reed-Muller encoding has been selected.

Although 16:11:4 Reed-Muller encoding of 9-bit data words is described above, Reed-Muller encoding is adaptable to encode words comprising a different number of bits also, for example for words comprising 11 bits.

Referring now again to the data B, the data words therein are any of header data words, element data words or parameter data words. There are four header words h1 to h4 which correspond to bit arrangements in the data B of $00000000000_b$, $10101010101_b$, $11111100000_b$ and $11111111111_b$ respectively and convey values of $00_b$, $01_b$, $10_b$ and $11_b$ respectively where an index b here denotes binary notation. These bit arrangements of the header words are chosen to be numerically as different as possible from one another in order to increase robustness of the data B; in other words, bit differences between the words are arranged to be as great as possible, thereby providing an advantage that probability of erroneously decoding header words when received is reduced. The header words serve as synchronisation marks in the data B for assisting the station 2b receiving the data B to synchronise to it. Reliable synchronisation is important because unreliable synchronisation may result in severe degradation of an image decoded and reconstructed within the system 1. The header words are assembled together in groups of four to form frame symbols in the data B. Each frame symbol conveys a code value in a range 0 to 255, namely in eight binary bits $b_7$, $b_6$, $b_5$, $b_4$, $b_3$, $b_2$, $b_1$, $b_0$ where $b_7$ is a most significant bit and $b_0$ is a least significant bit. As an example, two frame symbols comprising sequences of header words h1, h1, h1, h4 and h4, h4, h4, h4 in the data B convey frame symbol values of 3 and 255 respectively.

The frame symbols convey code values which have significance according to Table 2. Each frame symbol in the data B is immediately accompanied by data relating to it in the form of the element data words or the parameter data words.

TABLE 2

| Frame symbol value | Data words associated with the frame symbol |
| --- | --- |
| 0–19 | $S_{n,1}$ data as recorded in $T_a$ |
| 20–39 | $S_{n,2}$ data as recorded in $T_a$ |
| 40–59 | $S_{n,3}$ data as recorded in $T_a$ |
| 60–79 | $S_{n,4}$ data as recorded in $T_a$ |
| 80–89 | $Sh_{m,1}$ data as recorded in $U_b$ |
| 90–99 | $Sv_{q,1}$ data as recorded in $U_b$ |
| 100–109 | $Sh_{m,2}$ data as recorded in $U_b$ |
| 110–119 | $Sv_{q,2}$ data as recorded in $U_b$ |
| 120–129 | $Sh_{m,3}$ data as recorded in $U_b$ |
| 130–139 | $Sv_{q,3}$ data as recorded in $U_b$ |
| 140–149 | $Sh_{m,4}$ data as recorded in $U_b$ |
| 150–159 | $Sv_{q,4}$ data as recorded in $U_b$ |
| 160–164 | Estimation parameter for bit plane array with index r = 1 |
| 165–169 | Estimation parameter for bit plane array with index r = 2 |
| 170–174 | Estimation parameter for bit plane array with index r = 3 |
| 175–179 | Estimation parameter for bit plane index with index r = 4 |
| 180–195 | $G_z$ colour palette information |
| 196 | Reed-Muller encoding applied |
| 197 | Reed-Muller encoding not applied |
| 198 | Code word size indicator |

TABLE 2-continued

| Frame symbol value | Data words associated with the frame symbol |
| --- | --- |
| 199 | Not used |
| 200–215 | Numerical values 0 to 15 respectively |
| 216 | Image halving applied |
| 217–255 | Not used |

The image header information is constructed from frame symbols and incorporates the arrays of elements $T_a$, $U_b$ and $G_z$. It is repeated three times in the data B, namely once at a start of the data B, once after the square picture elements described by the elements $X_{n,r}$, $Y_{n,r}$ and once at the end of the data B. The header information is sent three times because it is critical data which, if corrupted, renders a transmitted image in the data B to the station 2b unintelligible.

The arrays of elements $T_a$ are monotonically referenced by the frame symbols in ranges of 0 to 19, 20 to 39, 40 to 59, 60 to 79 where, for example, the frame symbols 0, 20, 40, 60 refer to $T_1$. The arrays of elements $U_b$ are monotonically referenced by the frame symbols in ranges of 80 to 89, 90 to 99, 100 to 109, 110 to 119, 120 to 129, 130 to 139, 140 to 149, 150 to 159 where, for example the frame symbols 80, 90, 100, 110, 120, 130, 140, 150 refer to $U_1$.

When the data outputting function 32 assembles the data B, the picture elements, the horizontal run length elements and the vertical run length elements are in an interleaved format as provided by the function 30. For example, an image encoded at the station 2a may result in a series of frame symbols and data words incorporated in the data B as provided in Table 3. Data in each row of the table in turn is incorporated into the data B as Frame symbol+Data word 1+Data word 2+ . . .

When the frame symbols are in a range of 0 to 159, the function 32 assembles the data words in sequences, each comprising a frame symbol followed by one or more pairs of data words. The frame symbols are used in the data B to punctuate the sequences.

TABLE 3

| Frame symbol value | Data-word 1 | Data-word 2 | Data-word 3 | Data-word 4 | Data conveyed |
| --- | --- | --- | --- | --- | --- |
| 0 | $X_{1,1}$ | $Y_{1,1}$ | $X_{2,1}$ | $Y_{2,1}$ | Two square groupings of size in $T_1$ located at $(X_{1,1}, Y_{1,1})$ and $(X_{2,1}, Y_{2,1})$ |
| 62 | $X_{1,4}$ | $Y_{1,4}$ | | | One square grouping of size in $T_3$ located at $(X_{1,4}, Y_{1,4})$ |

Pixels $Q_{i,j}$ which are of most frequently occurring colour in the image are encoded in the encoding function 26 with the corresponding bit plane pixels $BQ_{i,j,1}$, $BQ_{i,j,2}$, $BQ_{i,j,3}$ and $BQ_{i,j,4}$ set to logic 0. The encoding function 28 subsequently does not encode them into picture elements or run length elements. This provides an advantage of removing information from the data B which does not contribute to reconstruction of the image and thereby providing more efficient data compression. As will be explained below, this advantage is obtained from using a default background colour when reconstructing the image at the station 2b which is chosen to correspond to a most frequently occurring colour present in the image, namely w=1 in Table 1, as communicated in the image header information.

The series 20 of functions alleviates a need to include EOL codes in the data B and, as each picture element is independently described therein, provides a solution to problems of error propagation from one band to another which occurs in the prior art, for example where SEA-RL encoding is employed.

The data B is passed from the computer 4a via the port P4 of the module 6a to the transceiver 8a which transmits it as radio radiation to the transceiver 8b where it is received as a sequence of z binary bits $D_g$ where g is an index in a range of 1 to z. Bit $D_1$ is a first bit and $D_z$ is a last bit of the sequence received. The transceiver 8b sends the sequence of bits $D_g$ via the port P4 of the module 6b to the computer 4b which stores it in its memory. The computer 4b is arranged to operate on the bits $D_g$ to generate decoded image data C.

Figure 3:
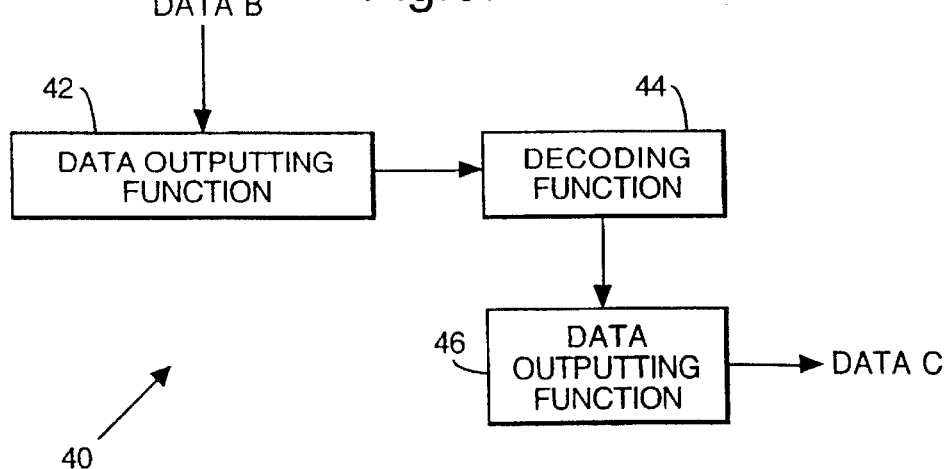
FIG. 3 illustrates a series of decoding functions employed in the system in FIG. 1.

Referring now to FIG. 3, a series of decoding functions executable within the computers 4a, 4b of the system 1 is indicated generally by 40. The series 40 comprises in order a data inputting function 42, a picture element decoding function 44 and a data outputting function 46. The series of functions 40 is executable on the bits $D_g$ to provide the data C suitable for printing at the printer 12b or sending to external equipment from the port P1 of the module 6b.

The inputting function 42 firstly applies an analysing function to a sequence of bits $D_g$ to establish header word size employed in the data B transmitted, for example to establish whether or not header word size has been reduced to accommodate a smaller image input into the system as will be described later. When checking for a word size of x bits, the analysing function partitions the sequence of bits $D_g$ into contiguous groupings of x bits size and then correlates the groupings with four templates of x bits size corresponding to expected header words of x bits size, for example $h_1$, $h_2$, $h_3$, $h_4$. The function attempts to partition the bits $D_g$ at a number of locations along their sequence to provide groupings for checking for synchronisation relative to the templates. When 75% or more of these templates correlate with the data $D_g$, a value of x presently employed for correlation with the bits $D_g$ is then deemed to be indicative of header word size. The analysing function searches the bits $D_g$ using a range of values of x until 75% or greater correlation is achieved.

Having established header word size x, the inputting function 42 then searches through the sequence of bits $D_g$ stored in the memory of the computer 4b and attempts to determine where a first frame symbol occurs in the sequence, that is the function 42 attempts to synchronise to the sequence. This is necessary otherwise the decoding function 44 is not able to decode the sequence correctly because early bits in the sequence may correspond to spurious noise unrelated to the data B which shifts the frame symbols along the sequence of bits $D_g$ in an unpredictable manner. The function 44 does this by correlating four bit templates of bits corresponding to the four header words h1 to h4 with the sequence commencing with the bits $D_1$ to $D_{11}$. If any one of the templates correlate by more bits than a preselected correlation threshold with the bits $D_1$ to $D_{11}$, the function 42 proceeds to correlate successive groupings of bits $D_{12}$ to $D_{22}$, $D_{23}$ to $D_{33}$ and $D_{34}$ to D44 with the four header words; if each of these three groupings correlate with any one of the header words, synchronisation is deemed to have occurred. If all the templates correlate by less than the threshold with the bits $D_1$ to $D_{11}$, the function 42 proceeds to correlate the templates with the bits $D_2$ to $D_{12}$ and subsequently with the bits $D_{13}$ to $D_{23}$, $D_{24}$ to $D_{34}$ and $D_{35}$ to $D_{45}$ and so on until synchronisation is achieved. If the sequence of bits is not corrupted, the sequence corresponds to contiguous data words of a constant bit grouping size, namely eleven bits.

The function 42 then proceeds to check through a remainder of bits $D_g$ in the sequence in repetitions of the bit grouping size to ensure that frame symbols occur with frequency greater than a preset synchronisation threshold. If frame symbols are found less frequently than the threshold after a bit $D_k$ in the sequence, the function 42 identifies this as a loss of synchronisation which may arise, for example, by any one of data corruption or bit slips resulting from insertion of additional bits into the sequence when the sequence is communicated between the transceivers 8a, 8b. If loss of synchronisation is estimated by the function 42 to have occurred after a bit $D_k$ in the sequence, the function 42 correlates the four templates of bits with the sequence commencing correlation with bits $D_{k-I}$ to $D_{k-I+11}$ where parameter I is a preselected search band width determining parameter to determine whether more bits than the correlation threshold are correlated. If the bits $D_{k-I}$ to $D_{k-I+10}$ are not correlated, the function 42 proceeds to correlate the templates with the bits $D_{k-I+1}$ to $D_{k-I+11}$ and so on until synchronisation is achieved. The function 42 terminates correlation if synchronisation is not achieved by the bits $D_{k+I}$ to $D_{k+I+10}$ and is preconfigurable to output an error message via the port P4 of the module 6b to the transceiver 8b which transmits the message to the station 2a that a major data corruption has occurred and retransmission of the data B starting at the bit $D_k$ is required.

Once a first frame symbol in the sequence of bits $D_g$ is identified, the function 42 then checks the sequence of bits $D_g$ to determine whether it incorporates a frame symbol of value 196 or 197 indicating whether or not Reed-Muller (RM) encoding has been applied to the sequence of bits. If the RM encoding has been applied, the function 42 applies a trellis decoding routine to decode the bits $D_g$. If RM encoding has not been applied, the function 42 proceeds with other routines for decoding the sequence of bits $D_g$ which are executed after termination of the trellis routine when invoked.

Trellis decoding routines are known in the prior art and are described in a book "Trellis Decoding of Block Codes: A Practical Approach" ISBN 0-7923-9860-2 Honary and Markarian 1997.

For explaining trellis decoding performed within the system 1, a trellis decoding routine indicated generally by 50 in FIG. 4 will be described. It comprises first, second, third and fourth stages as shown included within dotted lines 60, 62, 64, 66 respectively. The routine 50 incorporates an input for receiving Reed-Muller encoded data words corresponding to the bits $D_g$; the data words are represented by words $H_{RM}$ in FIG. 4. The words $H_{RM}$ are as defined in Equation 3 above but each will be represented by bits $[q_{16}, q_{15}, q_{14}, q_{13}, q_{12}, q_{11}, q_{10}, q_9, q_8, q_7, q_6, q_5, q_4, q_3, q_2, q_1]$ for purposes of explaining the routine 50. The routine 50 incorporates an output V at which decoded data is output, and comprises twenty six nodes 70 to 78, represented by ellipses, interlinked by vector paths 80 to 86, represented by arrows between the nodes in FIG. 4. The nodes 70 to 78 and the vector paths 80 to 86 are software elements which have no real physical existence but serve to explain operation of the routine 50. Each vector path 80 to 86 has branch vectors associated therewith, for example branch vectors 92a are associated with a vector path 80a.

Operation of the trellis decoding routine 50 will now be described with reference to FIG. 4 for decoding one of the data words $H_{RM}$. The routine 50 receives the word $H_{RM}$ at the node 70 of its first stage 60; in an event of data corruption, one or more of the bits $q_1$ to $q_{16}$ may be in error. Next, the routine 50 calculates Euclidean distances of the bits $q_{16}$, $q_{15}$, $q_{14}$, $q_{13}$ of the word $H_{RM}$ from corresponding bits of branch vectors 92 shown in FIG. 4 associated with vector paths 80 from the node 70. Euclidean distance here refers to the number of bits by which the bits $q_{16}$, $q_{15}$, $q_{14}$, $q_{13}$ differ from the branch vectors 92. A vector path 80 whose associated branch vectors have a smallest associated value of Euclidean distance from the bits $q_{16}$, $q_{15}$, $q_{14}$, $q_{13}$ is then selected by the routine 50 which identifies a node 72 linked by the vector path 80; this node 72 will be referred to as a first reference node.

Next, the routine 50 calculates Euclidean distances of the bits $q_{12}$, $q_{11}$, $q_{10}$, $q_9$ from corresponding bits of branch vectors 94 of vector paths 82 associated with the first reference node 72. A vector path 82 having a smallest associated value of Euclidean distance from the bits $q_{12}$, $q_{11}$, $q_{10}$, $q_9$ is then selected by the routine 50 which identifies a node 74 linked by the vector path 82; this node will be referred to as a second reference node. The routine 50 then calculates Euclidean distances of the bits $q_8$, $q_7$, $q_6$, $q_5$ from the branch vectors 96 of vector paths 84 associated with the second reference node. A vector path 84 having a smallest associated value of Euclidean distance from the bits $q_8$, $q_7$, $q_6$, $q_5$ is then selected by the routine 50 which identifies a node 76 linked by the vector path 84; this node will be referred to as a third reference node. Finally, the routine 50 then calculates Euclidean distances of the bits $q_4$, $q_3$, $q_2$, $q_1$ from the branch vectors 98 vector paths 86 associated with the third reference node. A vector path 86 having a smallest associated value of Euclidean distance from the bits $q_4$, $q_3$, $q_2$, $q_1$ is then selected by the routine 50 which identifies the node 78 linked by the vector path 84; this node will be referred to as a fourth reference node.

The vector paths 80, 82, 84, 86 from the node 70 to the node 78 followed by the routine 50 when analysing the word HRM are then used for generating a word at the output V corresponding to a decoded version of the word $H_{RM}$.

The trellis decoding routine then checks the five data bits added by the outputting function 32 to each word in the data B to check for correct parity with the word. If parity is not correct, the function 42 is preconfigurable to output an ARQ message via the port P4 of the module 6b to the transceiver 8b which transmits the message to the transceiver 8a. The transceiver 8a sends the message via the port P4 of the module 6a to the computer 4a which responds to the message by resending the data word which has been corrupted via the port P4 of the module 6a to the transceiver 8a for transmission to the transceiver 8b from where it is passed through the module 6b to the computer 4b.

After completion of the trellis decoding routine if invoked in the sequence of bits $D_g$, or after checking for synchronisation in the function 42 when the trellis decoding routine is not invoked in the bits $D_g$, the function 42 then proceeds to extract three sets of image header information from the sequence of bits $D_g$ and compares the sets of information to identify inconsistencies between them. If two or more of the sets are consistent with one another, those sets are used for decoding the sequence of bits $D_g$ to generate the data C. If all three sets are different from one another, the function 42 is preconfigurable to output an error message via the port P4 of the module 6b to the transceiver 8b which transmits the message to the station 2a that a major data corruption has occurred and retransmission of the image header information is required.

If two or more of the sets of header information are consistent with one another, the function 42 proceeds to use this information to check for inconsistencies in square picture and run length element data which are interleaved in the data B as described above, namely inconsistencies relating to descending size order conveyed by the frame symbols in the sequence of bits $D_g$. If inconsistencies are identified by the function 42, it is preconfigurable to send a message identifying the data relating to frame symbols via the transceiver 8b to the station 2a to request retransmission of the frame symbols and associated element data therefrom.

When inconsistencies in the data B conveyed in the sequence of bits $D_g$ are corrected by the function 42, for example by requesting retransmission of corrupted element data, it passes a verified version of the sequence, namely data Bv, to the decoding function 44 which operates on it to generate a reconstructed image. The function 44 introduces four bit plane arrays of pixels $RQ_{i,j,r}$ which are preset to logic 0 value. This ensures that they are preset to a colour which occurs most often in the image encoded in the data Bv; the colour corresponds to modal colour which is a most frequently occurring colour value in the pixels $Q_{i,j}$. It then proceeds to interpret the square picture, horizontal run length and vertical run length element data incorporated in the data Bv and set the pixels $RQ_{i,j,r}$ to logic 1 value where they are addressed by it. For example, data in the first row of Table 3 will result in pixels $RQ_{a,b,1}$ being set to logic 1 value where an index a is in a range of $X_{1,1}$ to $X_{1,1}+T_1$ and an index b is in a range of $Y_{1,1}$ to $Y_{2,1}+T_1$ and also here the index a is in a range of $X_{2,1}$ to $X_{2,1}+T_1$ and the index b is in a range of $Y_{2,1}$ to $Y_{2,1}+T_1$.

When decoding the data Bv, the decoding function 44 checks for errors which disrupt ordered element interleaving sequence therein as established by the interleaving function 30, for example disruption of descending values of the elements $S_{n,r}$, $Sh_{m,r}$, $Sv_{q,r}$ and disruption of ascending values of their respective associated elements $Y_{n,r}$, $Yh_{m,r}$, $Yv_{q,r}$ when contiguous identical values of their respective elements $S_{n,r}$, $Sh_{m,r}$, $Sv_{q,r}$ occur in the data Bv. If a $S_{n,r}$, $Sh_{m,r}$, $Sv_{q,r}$ element value is out of sequence in the data Bv, an error in the data Bv is likely. When an error is detected, the function 44 is arranged to examine two preceding elements and two following elements, for example two preceding elements $S_{n-2,r}$, $S_{n-1,r}$ and two following elements $S_{n+1,r}$ $S_{n+2,r}$ are examined when the function 44 detects an error in element $S_{n,r}$ value. The function 44 calculates a value for a confidence factor $C_f$ by performing an examination of an element and its associated two preceding elements and its two following elements. The factor $C_f$ is initial set to a value zero before commencing the examination. The factor $C_f$ is incremented if, when comparing contiguous pairs of the elements, for example the elements $S_{n,r}$ $S_{n+1,r}$, their associated address element values are in a correct interleaved order. When $C_f=3$, one or more errors in the elements have been detected by the function 44. When the factor $C_f$ is less or equal to a value 2, the $S_{n,r}$, $Sh_{m,r}$, $Sv_{q,r}$ element value and its associated address elements $X_{n,r}$, $Xh_{m,r}$, $Xv_{q,r}$, $Y_{n,r}$, $Yh_{m,r}$, $Yv_{q,r}$ are removed from the data Bv. The function 44 performs a complete error check through the data Bv by evaluating a confidence factor for each element $S_{n,r}$, $Sh_{m,r}$, $Sv_{q,r}$ and its associated address elements.

When interpreting the square picture, horizontal run length and vertical run length element data incorporated in the data Bv by setting the pixels $RQ_{i,j,r}$ to logic 1 value where they are addressed by it, the function 44 is adapted to check that none of the pixels $RQ_{i,j,r}$ is set more than one time. If a pixel $RQ_{i,j,r}$ is set more than once when decoding the data Bv, this is indicative of an error in the data. Multiple setting of an pixel $RQ_{i,j,r}$ will be referred to as double decoding thereof.

The function 44 incorporates a correlation routine for detecting double decoding. When double decoding of a square or run length element is about to occur when decoding the data Bv, either one or both of its associated addressing elements, for example $X_{n,r}$, $Y_{n,r}$, or its picture or run length element value, for example $S_{n,r}$, is incorrect provided that one or more earlier decoded picture or run length elements have not been corrupted and therefore already used to set pixels $RQ_{i,j,r}$ incorrectly. Assuming that a new corrupted picture or run-length element which gives rise to double-decoding has not yet been decoded by setting pixels $RQ_{i,j,r}$ to a value 1, the routine proceeds to decode it without modifying it if less than 50% of its corresponding pixels do not become double decoded, else the routine uses correlation techniques to find a region of the arrays of pixels $RQ_{i,j,r}$ where the new element may be decoded subject to giving rise to a minimal degree of double decoding. The correlation techniques involve repeatedly modifying address element values associated with the new element and attempting to decode it by temporarily test setting pixels $RQ_{i,j,r}$ and monitoring occurrence of double decoding arising when test setting the pixels $RQ_{i,j,r}$. After performing correlation, the new element is eventually decoded onto the pixels $RQ_{i,j,r}$ where it results in a minimal amount of double decoding by setting these pixels $RQ_{i,j,r}$ to logic value 1. The correlation routine is thereby effective at repairing damaged address elements in order to relocate their associated corrupted picture and run length elements onto more probable regions of the arrays of pixels $RQ_{i,j,r}$.

When the square picture and run length element data has been interpreted and the pixels $RQ_{i,j,r}$ set accordingly as described above, the function 44 introduces an image array of pixels $RP_{i,j}$ into which a reconstruction of the image input to the station 2a is generated. For each combination of indices i and j, the pixels $RQ_{i,j,1}$, $RQ_{i,j,2}$, $RQ_{i,j,3}$ and $RQ_{i,j,4}$ are interpreted using the entropy encoding relationship in Table 1 to determine a value $w_o$ for index w associated with these pixels. For the value $w_o$ thereby determined, a colour value for the pixel $RP_{i,j}$ is determined from the elements $G_z$ included in the image header information in the data B by equating it to the element $G_{wo}$, namely $RP_{i,j}=G_{wo}$. When this has been undertaken for all values of the indices i and j, the array of pixels $RP_{i,j}$ in memory of the computer 4b is a reconstruction of the array of pixels $Q_{i,j}$ in the computer 4a.

The pixels $RP_{i,j}$ are then passed to the data outputting function 46 which formats them to provide data C suitable for display on a monitor screen of the computer 4b, for output at the printer 12b or for external equipment (not shown) connected to the port P1 of the module 6b.

Although the array of pixels $P_{i,j}$ is described above as comprising 2000 by 2000 pixels, the image inputted into the station 2a may not always fill the image field. In this situation, the system 1 is reconfigurable to operate with reduced ranges for the indices i and j, such as 1024 by 1024 pixels or 512 by 512 pixels. This provides an advantage that bit width of the data words in the data B is reduced from eleven bits thereby resulting in less data to be transmitted between the stations 2.

In an alternative embodiment of the system 1, the data outputting function 46 is configured to provide preselectable despeckling of the pixels $RP_{i,j}$ in an identical manner to despeckling provided in the despeckling function 24, namely the pixels $RP_{i,j}$ are subjected to at least one of the despeckling modes 1, 2 and 3 before being formatted to provide the output data C. Despeckling may be applied to one or more preselected subsets of the pixels $RP_{i,j}$, namely zone despeckling of the pixels $RP_{i,j}$ may be undertaken. Despeckling applied to received data provides an advantage that image damage arising from transmission errors resulting in additional speckle in the pixels $RP_{i,j}$ may be at least partially disguised.

In another alternative embodiment of the system 1, the computers 4a, 4b may be arranged, when decoding received data, to disregard data corresponding to relatively smaller groupings of elements received after data corruption has occurred where a coarse rendition of the image based on data receive prior to the occurrence of data corruption is acceptable.

In another alternative embodiment of the system 1, the picture element encoding function 28 may be arranged to process an image as represented by the pixels $Q_{i,j}$ in zones, namely the image is subdivided into zones comprising typically differing amounts of image information relative to one another. When the encoding function 28 encodes the pixels $Q_{i,j}$, the limits $M_u$, $M_l$, $R_u$ and $R_l$ may be made variable depending upon which zone the pixels $BQ_{i,j,r}$ to be encoded are associated. This provides an advantage that zones which incorporate critical information may thereby be encoded to a relatively higher resolution compared to zones incorporating relatively unimportant information. Zone-based encoding enhances data compression for zones comprising relatively unimportant image information and critical information in other zones is conveyed. For example, a peripheral region the image comprising relatively little information may be encoded coarsely with $M_l$ and $R_l$ set to values 10 and 5 respectively, whereas a central region of the image may be encoded with $M_l$ and $R_l$ set to values 3 and 1 respectively.

In another alternative embodiment of the system 1, the encoding function 26 performs a cluster bit encoding routine which generates an alternative mapping relationship to the entropy relationship provided in Table 1 for use when mapping each pixel $Q_{i,j}$ onto corresponding pixels in the four bit plane arrays $BQ_{i,j,r}$. The cluster routine provides an advantage that larger groupings of neighbouring enabled pixels $BQ_{f,g,r}$ of unity value are generated which, when identified by the square element extraction routine and the run length extraction routines, provide increased data compression of approximately 15% in resulting data B compared to data B generated by mapping the pixels $Q_{i,j}$ using the entropy relationship in Table 1.

The cluster encoding routine introduces a two dimensional neighbouring colour array of elements $N_{e,f}$ where indices e and f are in a range of 1 to 16 and correspond numerically to colour values recorded in the pixels $Q_{i,j}$. The elements $N_{e,f}$ are preset to zero value. The routine then scans through all the array of pixels $Q_{i,j}$. For each pixel $Q_{i,j}$, the routine equates the index e to a numerical value conveyed in the pixel $Q_{i,j}$. The routine then examines values in eight neighbouring pixels to $Q_{i,j}$, namely pixels $Q_{i-1,j}$, $Q_{i+1,j}$, $Q_{i-1,j-1}$, $Q_{i, j-1}$, $Q_{i+1, j-1}$, $Q_{i-1, j+1}$, $Q_{i, j+1}$ and $Q_{i+1, j+1}$. For each of these neighbouring pixels, the routine equates a numerical value conveyed therein to the index f and then increments the element $N_{e,f}$ thereby indexed. The routine thus compiles information in the elements $N_{e,f}$ relating to frequency with which pixels $Q_{i,j}$ of different colour values neighbour one another within the array of pixels $Q_{i,j}$.

The routine then generates a mapping relationship for mapping data conveyed in the pixels $Q_{i,j}$ to corresponding pixels in the four bit plane arrays $BQ_{i,j,r}$. The mapping is arranged to encode pixels $Q_{i,j}$ having a colour value which occurs most frequently in the image as logic 0 values in corresponding pixels $BQ_{i,j,r}$ in the bit plane arrays as for entropy encoding. When generating the mapping, the routine examines the array of elements $N_{e,f}$ to determine therefrom pairs of colour which occur most frequently together in the image; these will be referred to as colour pairs. The routine then compiles the pairs into a sequence in order of decreasing colour pair occurrence frequency in the image. It then configures the mapping for each colour pair, commencing with a most frequently occurring colour pair, so that pixels $Q_{i,j}$ having colour values of that colour pair are encoded by progressively setting more corresponding bit plane pixels $BQ_{i,j,r}$ from logic 0 to logic 1 as colour pair occurrence frequency decreases. Moreover, the mapping is configured when encoding pixels $Q_{i,j}$ having colour values of a colour pair to set their corresponding bit plan pixels $BQ_{i,j,r}$ to differ from one another by as few bit changes as possible, thereby providing larger groupings of neighbouring pixels which are identifiable by the square and run length routines. Occurrence of pixels $Q_{i,j}$ having a colour value which most frequently neighbour onto pixels $Q_{i,j}$ of the same colour value are not regarded as colour pairs when generating the mapping relationship. The routine then applies the mapping relationship to the pixels $Q_{i,j}$ for generating corresponding bit plane pixels $BQ_{i,j,r}$.

The routine also generates an alternative sequence of colour correspondence in the array of elements $G_z$ which is communicated in the image header information.

An example will now be provided to illustrate operation of the cluster encoding routine. In an image, a most frequently occurring colour corresponds to a numerical value 9. Pixels $Q_{i,j}$ of this colour value are encoded into corresponding pixels in the bit plane arrays $BQ_{i,j,r}$ by setting them to a logic value 0. Moreover, pairs of colours neighbouring one another in the image are provided in Table 4 in a descending order of neighbouring frequency:

TABLE 4

| Colour | neighbours onto Colour | Occurrence frequently |
|---|---|---|
| 4 | 5 | Most frequency |
| 5 | 4 | |
| 8 | 9 | |
| 9 | 8 | |
| 7 | 8 | |
| 6 | 7 | |
| 10 | 9 | |
| 11 | 10 | |
| 12 | 11 | |
| 13 | 12 | |
| 3 | 4 | |
| 14 | 13 | |
| 16 | 1 | |
| 15 | 1 | |
| 2 | 1 | |
| 1 | 2 | Least frequently |

The routine generates a mapping relationship as provided in Table 5 in this example. In the table, colour pairs are shown together to illustrate pixel $BQ_{i,j,r}$ values which distinguish each of the colours.

TABLE 5

| Index w value, $G_w$ | Colour value | $BQ_{i,j,1}$ | $BQ_{i,j,2}$ | $BQ_{i,j,3}$ | $BQ_{i,j,4}$ |
|---|---|---|---|---|---|
| 2 | 4 | 0 | 0 | 0 | 1 |
| 4 | 5 | 0 | 0 | 1 | 1 |
| 1 | 9 | 0 | 0 | 0 | 0 |
| 3 | 8 | 0 | 0 | 1 | 0 |

TABLE 5-continued

| Index w value, $G_w$ | Colour value | $BQ_{i,j,1}$ | $BQ_{i,j,2}$ | $BQ_{i,j,3}$ | $BQ_{i,j,4}$ |
|---|---|---|---|---|---|
| 3 | 8 | 0 | 0 | 1 | 0 |
| 7 | 7 | 0 | 1 | 1 | 0 |
| 5 | 6 | 0 | 1 | 0 | 0 |
| 7 | 7 | 0 | 1 | 1 | 0 |
| 9 | 10 | 1 | 0 | 0 | 0 |
| 1 | 9 | 0 | 0 | 0 | 0 |
| 9 | 10 | 1 | 0 | 0 | 0 |
| 10 | 11 | 1 | 0 | 0 | 1 |
| 6 | 12 | 0 | 1 | 0 | 1 |
| 10 | 11 | 1 | 0 | 0 | 1 |
| 6 | 12 | 0 | 1 | 0 | 1 |
| 8 | 13 | 0 | 1 | 1 | 1 |
| 12 | 3 | 1 | 0 | 1 | 1 |
| 2 | 4 | 0 | 0 | 0 | 1 |
| 8 | 13 | 0 | 1 | 1 | 1 |
| 11 | 14 | 1 | 0 | 1 | 0 |
| 13 | 16 | 1 | 1 | 0 | 0 |
| 14 | 1 | 1 | 1 | 0 | 1 |
| 15 | 15 | 1 | 1 | 1 | 0 |
| 14 | 1 | 1 | 1 | 0 | 1 |
| 16 | 2 | 1 | 1 | 1 | 1 |
| 14 | 1 | 1 | 1 | 0 | 1 |

Pixels $Q_{i,j}$ which have a colour value 9 occur most frequently and are hence recorded as a default colour by setting corresponding bit plane pixels $BQ_{i,j,r}$ to a value 0. Pixels $Q_{i,j}$ which have a colour value 4 occur most frequently neighbouring pixels $Q_{i,j}$ which have a colour value 5, hence pixels $Q_{i,j}$ having a colour value 4 are represented by only one bit plane value change in corresponding bit plane pixels $BQ_{i,j,r}$ compared to those of pixels $Q_{i,j}$ having a colour value 5; in other words, pixels $Q_{i,j}$ having a colour value 9 are represented by pixels $BQ_{i,j,1}=0$, $BQ_{i,j,2}=0$, $BQ_{i,j,3}=0$, $BQ_{i,j,4}=0$, pixels $Q_{i,j}$ having a colour value 4 are represented by pixels $BQ_{i,j,1}=0$, $BQ_{i,j,2}=0$, $BQ_{i,j,3}=0$ and $BQ_{i,j,4}=1$ and pixels $Q_{i,j}$ having a colour value 5 are represented by those of colour value 4 except that pixel $BQ_{i,j,3}=1$. Thus, the mapping represents neighbouring pixels $Q_{i,j}$ whose colour values frequently occur together by as few changes in corresponding bit plane pixel $BQ_{i,j,r}$ values as possible thereby creating larger groupings of neighbouring pixels for the square extraction and the run length extraction routines to identify and hence improving data compression efficiency of the system 1.

Colour values in a second column of Table 4 are recorded in the array of elements $G_z$ for use when later decoding data to reconstruct the image.

In the embodiments of the invention described above, the system 1 encodes images as a sequence of square elements and run length elements in the data B. These elements are visualisable as square and length shapes on account of corresponding pixels groupings delineating such shapes when the pixel arrays $BQ_{i,j,r}$ and $RQ_{i,j,r}$ are regarded as two dimensional planes with pixels regularly distributed therein; the shapes will also be referred to as digit distributions. Rectangularly shaped elements provide superior tessellation properties compared to other types of element shapes. In another alternative embodiment of the system 1, triangular, hexagonal, trapezoidal or other geometrically shaped groupings of neighbouring pixels $BQ_{i,j,r}$ of logic 1 value are identified by the encoding function 28 and recorded as picture elements in the data B. In this embodiment, the images may be partitioned into zones which are encoded using preselected types of geometrical grouping shapes appropriate to each of the zones. Moreover, a combination of different geometrical grouping shapes may be preselected to achieve particularly efficient data compression.

Furthermore, the combination of geometrical grouping shape may be selected automatically in response to information content of the image after it is input into this embodiment. In the embodiment, use of right angle triangular element groupings provides an advantage that they may be efficiently described by three parameters, namely their position, size and orientation.

The system 1 described above communicates an image in sixteen colours from black to white, for example using colours red, green, blue and yellow. In another alternative embodiment of the system 1, grey features of images may also be communicated. This is achieved in the embodiment by increasing sizes of the arrays $F_y$ and $G_z$ and assigning a range of values in the pixels $P_{i,j}$ to correspond to shades of grey in the image. Moreover, the number of bit plane arrays may be increased, namely the index r may be greater than a value four, and entropy encoding as provided in Table 1 redefined to accommodate a greater number of shades and colours. Such colour rendition is not accommodated in the prior art, for example prior art SEA-RL encoding supports black-white image communication only.

In another embodiment of the system 1, the arrays $F_y$ and $G_z$ may be arranged for encoding images so that only black, white and grey shade features are encoded into the bit plane arrays $BQ_{i,j,r}$. When the system 1 is configured for communicating images incorporating black-white features only, it may be simplified to incorporate a single bit plane array from which groupings of neighbouring pixels are identified by square element and run length element routines for proving encoded output data.

In another alternative embodiment of the system 1, encoder and decoder estimation (PEST) routines are incorporated into the picture element encoding function 28 and into the decoding function 44 respectively. The encoder estimation routine is arranged to operate at a stage after completion of the square picture element routine and before execution of the run length extraction routine described above. At the stage, the enabled pixels $BQ_{i,j,r}$ correspond to a residual image which incorporates a number of isolated pixels situated at locations associated with corners of features in the image represented by the pixels $Q_{i,j}$. These isolated elements are inefficient to encode. The PEST routine is arranged to estimate occurrence of pixels at inside corners between abutting square element groupings extracted from the arrays of pixels $BQ_{i,j,r}$ described by the elements $X_{n,r}$, $Y_{n,r}$ and $S_{n,r}$ for each value of the index r in turn and to correlate this with the residual images remaining in the arrays of pixels $BQ_{i,j,r}$ to generate an estimation parameter. The decoder estimation routine is arranged to insert enabled pixels at inside corners of features recorded in the arrays of pixels $RQ_{i,j,r}$ based upon the estimation parameter. The parameter generated by the encoder estimation routine is conveyed in the data B by frame symbols 160 to 179 as provided in Table 2. The estimation routine provides an advantage of increased data compression in the data B by exploiting redundancy in the image which is efficiently conveyed by the estimation parameter.

Two pixel groupings are defined as abutting one another, and also referred to as neighbouring one another, when at least one pixel in one of the groupings has indices i,j which differ from those of a pixel in the other grouping by only one count in either or both of the indices i,j.

The encoder estimation routine operates on the arrays of elements $X_{n,r}$, $Y_{n,r}$ and $S_{n,r}$ for each value of the index r in turn. The routine identifies where groupings of pixels $BQ_{i,j,r}$ abut with one another to form inside corner features and then estimates pixels according to a preselected estimation parameter which are likely to be present at these features. The estimation parameter relates to a degree of rounding applied to these features. It then performs a correlation with the residual images remaining in the arrays of pixels $BQ_{i,j,r}$ after completion of the square picture element extraction routine described above to determine a degree of accuracy to which the estimated pixels correlate to the residual pixels. If the correlation is greater than a preselected threshold, the routine terminates by incorporating the estimation parameter into the image header information in the data B and modifying those pixels remaining in the arrays of pixels $BQ_{i,j,r}$ which are estimable from the estimation parameter by switching their logic value.

If the estimation is less than the threshold, the estimation parameter is increased to provide more rounding and the routine is then repeated until a best estimation is obtained. When the best estimation is obtained, the routine terminates by incorporating the estimation parameter into the image header information in the data B and modifying those pixels remaining in the arrays of pixels $BQ_{i,j,r}$ which are estimable from the estimation parameter by switching their logic value. If all the correlations are less than the threshold, estimation is abandoned and the estimation parameter is not incorporated into the data B. The threshold relates to whether increased data compression is achievable in the data B by encoding the image by executing the square and run length extraction routines in combination with including the estimation parameter and switching logic values of pixels estimable using the estimation parameter in comparison to encoding the image by executing only the square element and run length extraction routines.

The decoder estimation routine is arranged to receive the estimation parameter conveyed in the image header information and generate pixels for the inside corner features in an identical manner to the encoder estimation routine. It then adds these to the pixels $RQ_{i,j,r}$ which are subsequently decoded and employed when reconstructing the image. The pixels generated from the estimation parameter are added to the pixels $RQ_{i,j,r}$ by performing a logic exclusive-OR addition of them. Incorporation of PEST into the system 1 has been found in practice to provide increased data compression approaching 20% for some types of image compared to the system 1 operating without PEST.

In another alternative embodiment of the system 1, the scanners 10a, 10b in FIG. 1 are replaced with cameras for remote surveillance purposes.

In another alternative embodiment of the system 1, the radio transceivers 8a, 8a are replaced with optical transceivers for communicating through an optical fibre network, for example as used for the Internet.

The bit plane pixels $BQ_{i,j,r}$, which may also for the purposes of this specification be referred to as digits, may be arranged to have values other than logic 0 and logic 1 in an alternative embodiment of the invention.

In another alternative embodiment of the invention, the decoding function 44 is adapted to identify conspicuous defects in the pixels $RP_{i,j}$ arising from data corruption. Such defects are known as artefacts because they often appear, for example, as isolated rectangular groupings of neighbouring pixels $RP_{i,j}$ when the data corresponds to a photographic image. In practice, photographic images rarely contain perpendicularly aligned straight edges.

Artefacts arise when square or run-length address elements in the bits D have become distorted to resemble other address elements therein but, nevertheless, maintain correct interleaved sequence and are hence not identified by the decoding function 44 as having been double decoded; these artefacts are known as black artefacts. Artefacts also arise when element groupings are not in correctly interleaved order in the bits D and are disregarded by the decoding function 44 when assigning values to the pixels $RQ_{i,j,r}$; these artefacts are known as white artefacts. In practice, white artefacts are generally more common than black artefacts.

Black artefacts are often recognisable in a pixellated image produced from the data C as square pixel groupings of a first colour bordered by pixels of a second colour which is dissimilar to the first colour. In the alternative embodiment, the function 44 incorporates an expanding kernel routine which performs a systematic search from the pixel $RP_{2,2}$ taking each pixel $RP_{i,j}$ neighbouring onto it of a first colour value as a seed pixel to work from. Surrounding neighbouring pixels $RP_{i,j}$ to each seed pixel form a kernel of pixels. For each kernel of pixels, the routine is arranged to count the number of pixels $RP_{i,j}$ of the first colour value and the number of pixels $RP_{i,j}$ of a second colour value. For a black artefact to be recognised, at least a first percentage of the pixels within the kernel must be of the first colour value and at least a second percentage of the pixels surrounding the kernel must be of the second colour value. If a black artefact is not recognised for each kernel, the kernel is expanded in size. For example, if the seed pixel is $RP_{\alpha o,\beta o}$ where $\alpha o$ and $\beta o$ are indices, a first kernel checked by the routine comprises pixels $RP_{\alpha 1,\beta 1}$ where an index $\alpha 1$ is in a range of $\alpha o-1$ to $\alpha o+1$ and an index $\beta 1$ is in a range of $\beta o-1$ to $\beta o+1$; a second expanded kernel checked comprises pixels $RP_{\alpha 2,\beta 2}$ where an index $\alpha 2$ is in a range of $\alpha o-2$ to $\alpha o+2$ and an index $\beta 2$ is in a range of $\beta o-2$ to $\beta o+2$, and so on. The routine ceases to expand each kernel checking for black artefacts when the number of pixels $RP_{i,j}$ of the first colour value included therein is less than $t(2k-1)^2$ where k is the number of times the kernel has been expanded, and t is a threshold parameter. A black artefact is recognised by the routine if:

(i) the number of pixels $RP_{i,j}$ of the second colour in the $k^{th}$ kernel is greater than or equal to 8tk; and (ii) the number of pixels of the first colour is greater than or equal to $t(2k-1)^2$.

When a black artefact is identified by the routine, its corresponding size element and address elements are recorded in an array $J_a$ so that it does not contribute to generation of the output image.

The routine may be repeated for various first and second colours as specified, for example, by a user of the system 1; the first and second colours referred to above for use by the routine are, for example, black and white respectively. Moreover, the first and second percentages may be selectable by the user depending upon image content; in practice, the first and second percentages are usually set to 85%.

Parameter t is settable to obtain a best compromise between removing artefacts and false recognition of uncorrupted features incorporated into the pixels $RP_{i,j}$.

In another alternative embodiment of the invention, the decoding function 44 incorporates a white artefact identification routine which is arranged to search the array of pixels $RP_{i,j}$ to identify where boundaries between neighbouring pixels of different colour value to one another occur therein; the boundaries searched for by the routine are equivalent to regular geometrical shapes in an image generated from the pixels $RP_{i,j}$. In practice, many images often do not incorporate features which are regular geometrical shapes, for example an image of a human face usually has continuously curved features. When an image generated from the pixels $RP_{i,j}$ contains 90° corner features, these features are potentially indicative of white artefacts.

The routine is arranged to correlate one or more templates of neighbouring pixel values with the arrays of pixels $RP_{i,j}$; the templates comprise, for example, a selection of corner features in a variety of different angular orientations. If correlation of at least one of the templates with a selected grouping of pixels $RP_{i,j}$ occurs, the routine records this as indicative of a potential white artefact. The routine then searches around surrounding pixels $RP_{i,j}$ near to the pixels where correlation has occurred to investigate whether or not correlation of other of the templates with the surrounding pixels is achievable. If the number of templates which correlate exceeds a predefined limit, the routine identifies the pixels correlating with the templates as forming a white artefact and records them as artefact data in an array $L_a$ so that they are not used when regenerating an image from the pixels $RP_{i,j}$.

The artefact data collated into the array $L_a$ may be later used in the decoding function 44 for correlating with the array of pixels $RP_{i,j}$ to find locations therein where the white artefacts may be incorporated for at least partially correcting defects arising from data corruption.

In an alternative embodiment of the invention, other types of additional encoding rather than Reed-Muller encoding may be employed, for example Reed-Solomon encoding. Moreover, control information associated with larger square and run length elements encoded into the data B may be inserted more frequently therein to further increase robustness of the data B to data corruption.

What is claimed is:

1. A data encoding system incorporating encoding means for encoding input data including:
    (a) analyzing means for analyzing the input data and generating corresponding digits; and
    (b) processing means for processing the digits to provide encoded output data,
    (c) the analyzing means is arranged to generate digits which are representative both of data distributions and of data occurrence probabilities, arranged to represent the input data in an array of digits and the processing means is arranged to identify groupings of digits of mutually similar value in the array for use in generating the encoded output data; and
    (d) the processing means is arranged to select groupings of digits for use in generating the output data, thereby providing at least one of data compression in the output data and increasing its robustness to data corruption.

2. An encoding system according to claim 1 further including decoding means for decoding the encoded data, the means including:
    (a) translating means for decoding the encoded data to provide groupings of digits which preserve information on data distributions and data occurrence probabilities encoded in the encoded data; and
    (b) interpreting means for interpreting the digits according to the occurrence probabilities to recreate the data in decoded form.

3. An encoding system according to claim 1, wherein the processing means is adapted to identify groupings of digits comprising digits which neighbor one another in the array for use in generating the output data.

4. An encoding system according to claim 1, wherein the decoding means is adapted to respond to corruption of digit grouping information in the encoded data received thereat by requesting selective retransmission of the digit grouping information and combining this information with previously received uncorrupted information for decoding the encoded data to recreate the data in decoded form.

5. An encoding system according to claim 1, wherein the processing means is adapted to represent the digits in each grouping by a single corresponding grouping size parameter in the encoded output data.

6. An encoding system according to claim 5 wherein the processing means is arranged to select square and linear groupings of digits.

7. An encoding system according to claim 1 wherein the analyzing means is arranged to despeckle the input data represented by the array of digits by identifying isolated digits in the array whose associated values are dissimilar to those of neighboring digits thereto and to modify the isolated digit values for at least one of increasing numbers of digits included in the groupings and decreasing the number of groupings required for representing the input data in the encoded output data.

8. An encoding system according to claim 7 wherein the analyzing means is arranged to partition the input data into a plurality of zones, and to despeckle digits corresponding to each zone by using a despeckling process preselected for that zone.

9. An encoding system according to claim 7 wherein the analyzing means is arranged to apply at least one of a mode 1, a mode 2 and a mode 3 despeckling process to the digits.

10. An encoding system according to claim 1, wherein the processing means is adapted to encode the groupings of digits into the encoded output data in an interleaved order corresponding to groupings with progressively smaller numbers of digits therein, and the translating means is adapted to check that groupings are encoded in an interleaved order in the encoded data for identifying that the groupings are uncorrupted.

11. An encoding system according to claim 10 wherein the translating means is arranged to filter the encoded data for identifying incorrectly interleaved data therein and the interpreting means is arranged to disregard the incorrectly interleaved data when recreating the data in encoded form.

12. An encoding system according to claim 1, wherein the processing means is adapted to search for digit groupings containing a number of digits, said number being in a predefined range, and encode them into the output data.

13. An encoding system according to claim 1, wherein the analyzing means is adapted to represent each data distribution of the input data in corresponding digits using entropy encoding by assigning to at least some of the distributions relatively more or fewer digits with non-default values according to whether occurrence probability of the distribution within the input data is relatively lower or higher compared to that of other distributions, subject to each data distribution being unambiguously encoded into the output data by the processing means searching the digits.

14. An encoding system according to claim 1, wherein the analyzing means is adapted to represent each data distribution of the input data using cluster encoding by assigning to at least some of the distributions relatively more or fewer digits with non-default values according to whether occurrence probability of the distribution within the input data is relatively lower or higher compared to that of other distributions, subject to:
   (a) each data distribution being unambiguously encoded into the output data by the processing means searching the digits; and
   (b) each data distribution being represented by a corresponding digit combination which differs from that of data distributions most frequently occurring in combination with it by as few digit value differences as possible.

15. An encoding system according to claim 1, wherein the analyzing means is arranged to represent a data distribution in the input data which occurs most frequently by assigning it a default value and the processing means is arranged to:
   (i) omit such default values when selecting digit groupings to be encoded into the output data for providing enhanced data compression; and
   (ii) include header information in the output data defining the data distribution which occurs most frequently;
and the decoding means is arranged to recreate the data distribution which occurs most frequently from the header information data when recreating the output data in decoded form.

16. An encoding system according to claim 1 wherein the processing means is arranged to apply additional forward error correction encoding to the encoded output data, and the translating means is adapted to decode the encoded data by using trellis decoding means.

17. An encoding system according to claim 16 wherein the processing means is arranged to apply Reed-Muller encoding.

18. An encoding system according to claim 1 wherein the processing means is adapted to incorporate one or more synchronization codes into the encoded data for assisting resynchronisation of the translating means to the data after loss or absence of synchronization.

19. An encoding system according to claim 1 wherein the analyzing means is adapted to analyze input data comprising image color information and to incorporate the information into the digits, the processing means is adapted to select groupings of the digits for use for providing encoded output data incorporating the color information, and the decoding means is adapted to receive the encoded data incorporating color information, decode it and recreate from it the input data including its color information.

20. An encoding system according to claim 1, wherein the analyzing means incorporates digit estimating means for estimating occurrence of neighboring digits occurring in association with groupings of digits selected by the processing means which neighbor onto one another and the processing means is adapted to include estimation parameters in the encoded output data indicative of the neighboring digits, and the decoding means is adapted to decode encoded data incorporating estimation parameters and estimate therefrom presence of neighboring digits for use in recreating the data.

21. An encoding system according to claim 1 wherein the analyzing means, the processing means, the translating means and the interpreting means are computer software implemented.

22. An encoding system according to claim 1 wherein the translating means is arranged to:
   (i) detect instances of double decoding from multiple setting of decoded digits indicating data corruption; and
   (ii) selectively disregard digits giving rise to double decoding when recreating the encoded data in decoded form.

23. An encoding system according to claim 22 wherein the translating means is arranged to correlate digit groupings giving rise to double decoding with digits already generated to identify alternative assignable digits for substitution therefor.

24. An encoding system according to claim 1, wherein the translating means is adapted to search the groupings of digits to identify corrupted groupings whose corresponding value is different from those of digits neighboring thereto and the interpreting means is arranged to disregard the corrupted groupings when recreating the data in decoded form.

25. An encoding system according to claim 24 wherein the translating means includes for comparison purposes predefined digit distributions referred templates, and is adapted to correlate the templates with the groupings of digits to identify corrupted groupings of digits and the interpreting means is adapted to disregard corrupted groupings when recreating the data in decoded form.

26. An encoding system according to claim 24 wherein the translating means is arranged to search for corrupted groupings of digits having a corresponding first value by searching the digits using progressively larger searching kernels and identifying corrupted groupings of digits when at least a first threshold percentage of digits included within the kernel are of the first value and at least a second threshold percentage of digits neighboring onto digits in the kernel are of a second value.

27. An encoding system according to claim 26 wherein the first and second threshold percentages are 85%.

28. A method of encoding input data in a data encoding system to provide encoded output data, the encoding system incorporating analyzing means for analyzing the input data and representing it in terms of digits, and processing means for processing the digits to generate the output data, and the method including the steps of
   (a) performing a frequency analysis on the input data to represent both data distributions and data occurrence probabilities in terms of digits to obtain at least one of data compression and increased corruption robustness; and
   (b) processing the digits to select groupings of digits for use in generating the output data.

29. A method of encoding input data and generating corresponding encoded output data, the including the steps of:
   (a) representing the input data as an array of quantised values;
   (b) determining occurrence probabilities for each of the values;
   (c) transforming the array of values to an array of digital numbers indicating respective occurrence probabilities;
   (d) searching the array to identify like-distributed sub-arrays of digits of digital numbers not associated with the value having the greatest occurrence probability;
   (e) assigning position and size parameters to each identified sub-array;
   (f) repeating the two preceding steps for further like-distributed sub-arrays with the omission of previously identified sub-arrays in accordance with a prearranged sequence; and
   (g) providing the encoded data in terms of the occurrence probabilities of the values and the position and size parameters of identified sub-arrays.

30. A method of communicating input data incorporating the steps of:
   (a) representing the input data as an array of quantised values;
   (b) determining occurrence probabilities for each of the values;
   (c) transforming the array of values to an array of digital numbers indicating respective occurrence probabilities;
   (d) searching the array to identify like-distributed sub-arrays of digits of digital numbers not associated with the value having the greatest occurrence probability;
   (e) assigning position and size parameters to each identified sub-array;
   (f) repeating the two preceding steps for further like-distributed sub-arrays with the omission of previously identified sub-arrays in accordance with a prearranged sequence;
   (g) providing encoded data in terms of the occurrence probabilities of the values and the position and size parameters of identified sub-arrays; and
   (h) processing the encoded data to produce decoded data by initially providing preset data values, and then changing individual preset values to input data values in accordance with the values and the position and size parameters of identified sub-arrays.

31. A method according to claim 30, wherein in step (h), the preset values are initially set to the input data value having the highest occurrence probability, and then the preset values are changed to input data values of less than highest occurrence probability in accordance with the values and the position and size parameters of identified sub-arrays.

32. A method of encoding input data including the steps of:
   (a) representing the input data as an array of quantised values;
   (b) determining occurrence probabilities for each of the values;
   (c) transforming the array of values to an array of digital numbers indicating respective occurrence probabilities, the digital numbers having default digits and non-default digits and the value having the highest probability being transformed to a number lacking a non-default digit;
   (d) searching the array to identify like-distributed sub-arrays of non-default digits;
   (e) assigning position and size parameters to each identified sub-array;
   (f) repeating the two preceding steps for further like-distributed sub-arrays with the omission of previously identified sub-arrays in accordance with a prearranged sequence; and
   (g) providing the encoded data in terms of the occurrence probabilities of the values and the position and size parameters of sub-arrays.

33. A data encoding system incorporating encoding means for encoding input data into encoded output data, the system including:
   (a) analyzing means for analyzing the input data and generating an array corresponding thereto; and
   (b) processing means for processing the array to provide the encoded output data,
   (c) the analyzing means is arranged to represent the input data as quantised values in the array, to determine occurrence probabilities for each of the values, and to transform the array of values to an array of digital numbers indicating respective occurrence probabilities; and
   (d) the processing means is arranged:
      (i) to search the array for identifying, according to a prearranged sequence, like-distributed sub-arrays of digits of digital numbers not associated with the value having the greatest occurrence probability;
      (ii) to assign position and size parameters to each identified sub-array; and
      (iii) to provide the encoded output data in terms of the occurrence probabilities of the values and the position and size parameters of identified sub-arrays.

34. An encoding system according to claim 33 further including decoding means for decoding the encoded data, the decoding means including:

(a) translating means for providing data values preset to the input data value having the highest occurrence probability; and
(b) interpreting means for changing individual preset values to input data values of less than highest occurrence probability in accordance with the values and the position and size parameters of identified sub-arrays for recreating the encoded data in decoded form.

* * * * *